United States Patent [19]

Carter, II

[11] 4,181,950
[45] Jan. 1, 1980

[54] ADAPTIVE PRIORITY DETERMINATION POWER DEMAND CONTROL METHOD

[75] Inventor: Woodward C. Carter, II, Maitland, Fla.

[73] Assignee: Westinghouse Electric Corp., Pittsburgh, Pa.

[21] Appl. No.: 838,334

[22] Filed: Sep. 30, 1977

[51] Int. Cl.$^2$ .......................... H02J 3/14; G06F 15/56
[52] U.S. Cl. .................................... 364/492; 307/39; 307/35
[58] Field of Search .................. 364/492, 493; 307/35, 307/39, 41, 52, 62; 324/103

[56] References Cited

U.S. PATENT DOCUMENTS

| | | | |
|---|---|---|---|
| 3,296,452 | 1/1967 | Williams | 235/151.21 |
| 3,522,421 | 8/1970 | Miller | 235/151.21 |
| 3,652,838 | 3/1972 | Dillon et al. | 235/151.21 X |
| 3,659,114 | 4/1972 | Polenz et al. | 235/151.21 X |
| 3,697,768 | 10/1972 | Johnston | 235/151.21 X |
| 3,862,430 | 1/1975 | Lenhart et al. | 307/62 X |
| 3,987,398 | 10/1976 | Burch | 307/52 X |
| 4,023,043 | 5/1977 | Stevenson | 235/151.21 X |
| 4,034,233 | 1/1977 | Leyde | 235/151.21 X |

Primary Examiner—Edward J. Wise
Attorney, Agent, or Firm—C. M. Lorin

[57] ABSTRACT

Power demand control on a plant having a plurality of load units of production, each operating between a starting time and an ending time to provide individual production outputs, is exercised by automatically shedding or restoring such load units in order to maintain power demand within an assigned demand limit. The control system provides adaptive priority determination by storing an image of the ON, or OFF, status of the load units into at least two memories (memory I and memory II) on a last ON, first OFF basis for the loads to be shed, and on a last OFF, first ON basis for the loads to be restored. Loads that are ON are stored in a first (ON) memory (memory I); loads that are being held OFF by the controller are stored in a second (DCOFF) memory (memory III). Also provided is a third memory (OFF) (memory II) to store the status of load units which are out of production and under independent control either after ending production or while being made ready to start production. Such independent control is interfaced with automatic power demand control by storing OFF status load units that were under independent controls but are now available for processing production into the second memory at the lowest priority and those having ended production being stored into the third memory at the highest priority. Load units which change status under power demand control to minimize demand error have their status locations in the first and second memory exchanged in preparation of subsequent automatic demand control during the demand control period. The load position in the first and second memories may be modified by the controller operators to enhance the probability of a given load turning ON or staying ON.

7 Claims, 21 Drawing Figures

ADAPTIVE PRIORITY DETERMINATION POWER DEMAND CONTROL METHOD

BACKGROUND OF THE INVENTION

The invention relates in general to power demand control for switching loads according to a priority schedule in a plant facility supplied by energy from a utility company so as to keep the demand at the end of a period of control within a preassigned demand limit. The invention relates in particular to a power demand control method in which the priority schedule is changed, or fixed in time, in accordance with the dynamics of operation of at least one of the loads to be switched, or in accordance with operator initiated commands. Such adaptive load priority determination is particularly applicable to arc furnace installations, since in such installations the decision to switch, or not to switch, an arc furnace should not only take into account the requirements of power demand limit but also the economics and requirements of production.

It is known from U.S. Pat. No. 3,566,147 of C. J. Masreliez to control a plurality of loads so as to connect them in a certain sequence and to disconnect them in an opposite sequence, in order to maintain a certain level of operation with the loads.

It is known from U.S. Pat. No. 3,842,249 of Geyer et al to practice selective load shedding in the sense of responding to overload by dropping the least important loads first.

It is known from U.S. Pat. No. 3,906,242 of R. H. Stevenson to provide load shedding and load reconnecting according to a changing priority scheme taking into account the user's needs at the time of control. In particular, Stevenson controls loads in accordance with accumulated thermal energy giving priority to "those thermal storage units which are least able to endure prolonged disruption as of the time of disconnection." The active loads are distributed in order to avoid peaks of consumption.

It is known from U.S. Pat. No. 3,602,703 of T. R. Polenz to switch a load of highest priority and control the power available to be switched after such switching by considering the known pattern of additional loads, so that so much of the successive stages of such an additional load can be switched as the remaining available power within an assigned demand limit.

It is known from U.S. Pat. No. 3,714,453 of J. Delisle et al to control switching of a plurality of loads on the basis of the power consumed by the loads and of the demand derived from the utility company.

The prior art of power demand control has been described and a technique used has been disclosed in U.S. Pat. No. 3,872,286 of R. Putman issued on Mar. 18, 1975. For the purpose of the description hereinafter of the preferred embodiment of the present invention, the description and drawings of the Putman patent are hereby incorporated by reference. The general technique of power demand control consists in predicting at successive operative points during a demand period, of for instance 15 minutes, the expected demand at the end of the period so as to derive an error (by reference to a demand limit) not to be exceeded. Shedding (switching OFF) or restoring (switching ON) of loads according to a priority table is performed by a computer from a computation of such demand error, which can be positive or negative. The Putman patent discloses a more refined controlling approach by the calculation of a residual error after calculation of a predicted result due to control of selectable loads, such residual error being used in subsequent calculations to determine if additional loads should be manipulated.

While very effective in adjusting the power demand during each demand period within the limit of an assigned target, the control technique of the Putman patent has been mainly applied in the past to derive substantial savings from the control of a category of loads having a controllable status as opposed to other loads left totally out of control. The latter are out of control because of constraints imposed on the loads, or because production requirements dictate that they remain unaffected by power demand control. This all or nothing approach with respect to control of the main units of production reduces the overall efficiency of power demand control. If, indeed, substantial savings can be derived from controlling under a priority schedule many loads which are supporting the production of a user's plant, it is desirable to include the main production units among the loads having a controllable status from a point of view of power demand control.

An object of the present invention is to provide a power demand control method handling sheddable and reconnectable loads, among which are production units. Typically, these will be a relatively few loads of relatively large size, as opposed to numerous, small loads.

Another object of the present invention is to provide switching of one or more production units, in or out of production, in accordance with a priority schedule depending on demand and aiming at a power demand limit not to be exceeded at the end of any of successive demand period.

A further object of the present invention is to combine scheduling of sheddable and reconnectable loads for limiting the demand of power in a user's facility for non-production loads and such scheduling for production loads, the load selection being in accordance with the production process within the facility.

Still another object of the present invention is to control with a computer the initiation and the termination of a plurality of production processes consuming energy in order to accommodate a desirable production pattern under the constraint of a predetermined power demand limit.

SUMMARY OF THE INVENTION

The present invention resides in a power demand control method which is effective to limit the demand of power by the selection of sheddable and reconnectable loads in accordance with a priority schedule which is modifiable as a function of the actual production profile of one or more production units.

More specifically, in a power demand control system the method of control is such that the power consumed by a production unit individually is used together with the power consumed by the overall plant for the prediction of a demand error and for the selection of loads to be shed or reconnected. With such a method, the availability for switching under the power demand control scheme is determined, for a particular production unit, by the actual production pattern of such production unit as well as by the overall demand error requiring power switching.

Another aspect of the present invention resides within a power demand control system in a method of switching loads including production units, the priority schedule used under the power demand limiting scheme being modified as a function of the actual production pattern of one or more such production units.

More specifically, in accordance with the present invention, selection between several production units for switching is made in accordance with the level of progression toward completion of the productive process in each unit.

Still more specifically, with a plurality of similar production units operable in parallel within a common power supply, the invention provides for switching ON on a "last OFF, first ON basis" and for switching OFF on a "last ON, first OFF basis", often referred to as a "LOFO" priority scheme. In addition, the invention provides means for an operator to cause any "OFF" load to be considered "last OFF" or any "ON" load to be considered the longest ON, so as to in effect give that load the least likelihood of being shed, or the most likelihood of being restored.

The invention is particularly applicable to arc furnaces. The invention permits regulatory action in controlling simultaneous operation of several arc furnaces, the number of arc furnaces effectively in service at a given time being a function of an assigned power demand limit and a function of the accumulation of power consumed during integrated portions of demand periods of control, thereby to maximize the utilization of the overall arc-furnace capacity within a given industrial plant.

The invention can be used with only units of production selected according to a priority scheme varying in relation to the production process, or within the context of power demand control extended to other types of controllable loads selected under a fixed priority, including loads having a status of constraints making them available for control when the attached constraints have been lifted as a result of fulfillment of assigned operative requirements by expiration of prescribed times ON or OFF, or by any externally lifted prohibition, or which have in any form regained their degree of freedom.

In a preferred application, the technique of computerized power demand limit of the prior art is applied to advantage to the control of arc furnaces in a plant supplied with power from a utility company.

In operation, the synchronizing ("DEMAND") pulse from the plant KWH meter resets the computer demand period timer and actual timing of the period is from the computer real-time clock. KWH pulses from the plant KWH meter are received by the controller as interrupts, or as frequently scanned contact closure inputs (CCI's) which represent KWH consumed. These interrupts initiate the calculation of the total KWH in the period in relation to the elapsed time of the period. From this data an actual point on the demand curve is determined, and the actual slope of the curve is determined using a weighted average of the last three pulse periods (last four pulses). This actual slope is used to predict final demand at the end of the period. Depending on the demand prediction, time into period, and values of various furnace constraints and control parameters, the computer may open, or close, the furnace power on permissive contacts to force the end of period demand toward the demand limit. The time at which a load is actually added, or shed, is determined and controlled in consideration of the incremental demand impact that particular load will have on the remaining portion of the period. It is considered that each load has a predetermined response time and this time is taken into account in determining whether to shed more than one load or add more than one load.

The computer control system calculates when to shed or add loads based on the actual current value of the load itself, which is stored in a memory of the system. At each kilowatt-hour pulse, the value in that memory for that load is updated as a function of the actual load being drawn. At the start of a heat, since there is no prior history for that heat, the nameplate rating, as defined by the user, is inserted into the table of load values.

Furnaces are shed on a "last ON-first OFF" basis.

Furnaces are restored on a "last OFF-first ON" basis.

If during an interval the controller is in a demand control mode (AUTO) it will inhibit any new furnace from being brought on-line until all loads previously shed have been restarted. However, the controller will keep track of, and automatically start, the new furnace after all those previously shed have been restored, provided that the starting of the new furnace will not put the demand over the demand limit for the remainder of the interval.

As a result, according to the present invention, the power demand limit control method is integrated with control of the arc furnaces as part of an adaptive control process thereof.

BRIEF DESCRIPTION OF THE DRAWINGS

The invention will now be described in the context of the supply of electrical energy by a utility power supply company to an industrial plant including a plurality of electrical furnaces, and reference shall be made to the accompanying drawings in which.

GENERAL DESCRIPTION OF THE INVENTION IN THE CONTEXT OF THE STRUCTURAL AND OPERATIVE CHARACTERISTICS OF THE POWER DEMAND CONTROL SYSTEM OF U.S. PAT. NO. 3,872,286

For the sake of clarity and for the purpose of illustration only, the present invention will be described in the context of the power demand control system of U.S. Pat. No. 3,872,286.

Figure 1:
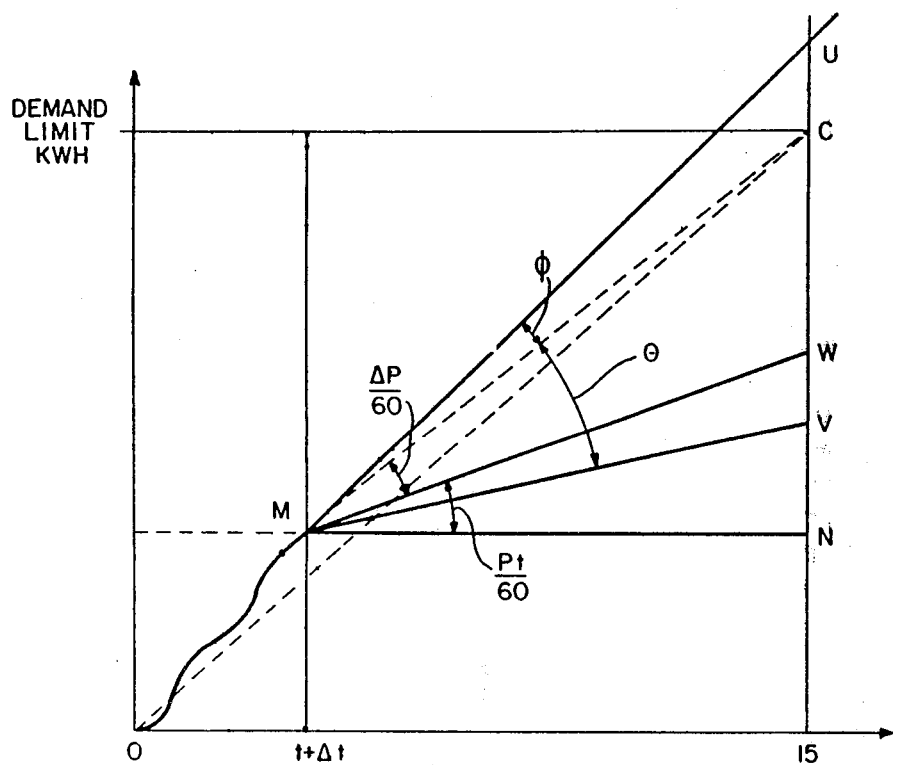
FIG. 1 illustrates diagrammatically the principle of calculation of the demand error used in a control system of the prior art for power demand control.

FIG. 1 illustrates the principle of calculation of the error for any point M along the trajectory during a demand period of 15 minutes. A clock installed by the power supply company determines the initial time of each demand period, (or the final time of a preceding demand period). The watthour meter provides a "KWH pulse" which represents the magnitude of the power which has been consumed during a certain time $\Delta t$ corresponding to a full rotation of the disc of the meter, thus representing a constant increment or unit of energy (KWH). Thus, the $\Delta t$ interval appearing along the time axis is essentially variable. This time interval is detected as a representation of the slope at point M and it represents the power $P_t$ in KW hour/hour. If the load of the plant is maintained in the same condition until the end of the 15 minute period, the energy curve will follow the tangent MW. However, the Demand Limit is set at C, therefore there is an error CW by default, which in terms of power is:

$$\Delta P = \frac{(60) \times CN}{15 - t} = P_t$$

as is evident from the geometry of triangles MNC and MWC. Having determined Slope=$(\Delta P)/60$ by triangulation, and the sign of the error, depending upon whether the intersection point W is above (−) or below (+) the target C, control is effected by selectively adding or shedding suitable loads in the plant. In order to more closely follow the target, a deadband may be provided on either side of the trajectory by defining two angles $\phi$ and $\theta$ which should not be exceeded. The deadband will permit effective demand control while avoiding excessive control activity as long as the projected tangent remains within the two limits MU and MV (FIG. 1) so defined. The upper limit MU will represent the "decrease vector" and the lower limit MV of the deadband will represent the "increase vector" for control. Such deadband can be made variable as shown in the Putman patent.

It will be hereinafter assumed that the power demand can be controlled by a plurality of loads which at least in part can only be switched ON, or OFF. However, by ON and OFF, it is understood that in a general sense the loads need not be switched by electrical connecting, or disconnecting. A power consumption can be increased or decreased by mechanical connection or disconnection of the load as well, such as by means of a clutch or valve actuation.

When several loads are available for being switched ON or OFF, there is a possibility that at times a load switched OFF by the controller may already be OFF. The particular load to be switched ON by the controller might have been previously put out of service. It is also possible that control of the demand be prevented by an overriding and external control equipment associated with the load, as is usual with air conditioners, chillers, or air compressors, for instance. Other types of constraints can be found in the particular industrial plant of a customer to a power company.

The selection of a load not only depends upon the overall status of the different loads, but also upon the behavior of any particular load in the user's plant. The control system therefore provides for a dynamic allocation of priorities in the selection of the loads to be controlled at any particular time.

The method also provides for relative control, rather than an absolute control of the loads, any selected and controlled load change being effected independently from the base load and from non-controlled loads.

The control method may also take into account the established constraints. For instance, besides interruptible loads which can be selected to be shed or to be added, there may be in the plant loads having a non-controllable status, which otherwise could defeat the control system. However, the control system may also limit its own capability of switching loads in order to accept the non-controllable loads as a favorable factor of correction when in the demand limit control mode, in particular by making use of a deadband.

The computer system in the demand limit control mode may moreover call for the determination of the constraints either off-line or on-line in order to be able to ascertain with improved accuracy the anticipated effect of control and prepare for the right decision in selecting the loads to be controlled at a given instant or for an emergency action by the present control operation.

Further, while providing for shedding loads or adding loads to limit the total power demand as desired at the end of any given demand period, the control method provides steps in order to maximize the needs for particular loads of the user. To this effect control might not be exerted during a first portion of the demand period, on the assumption that sufficient possibilities of meeting the objectives are still left and are available, as a result of an improved control and improved selection, in the latter part of the demand period. Control is performed, during a second and major portion of the demand period. In addition, during a third field of control, a temporary target below the objective can be imposed for control until a certain time limit relatively close to the end of the demand period and when such limit has been reached, the bias so established is progressively reduced to zero until the end of the demand period, at which time the demand limit is substantially achieved.

Figure 2:
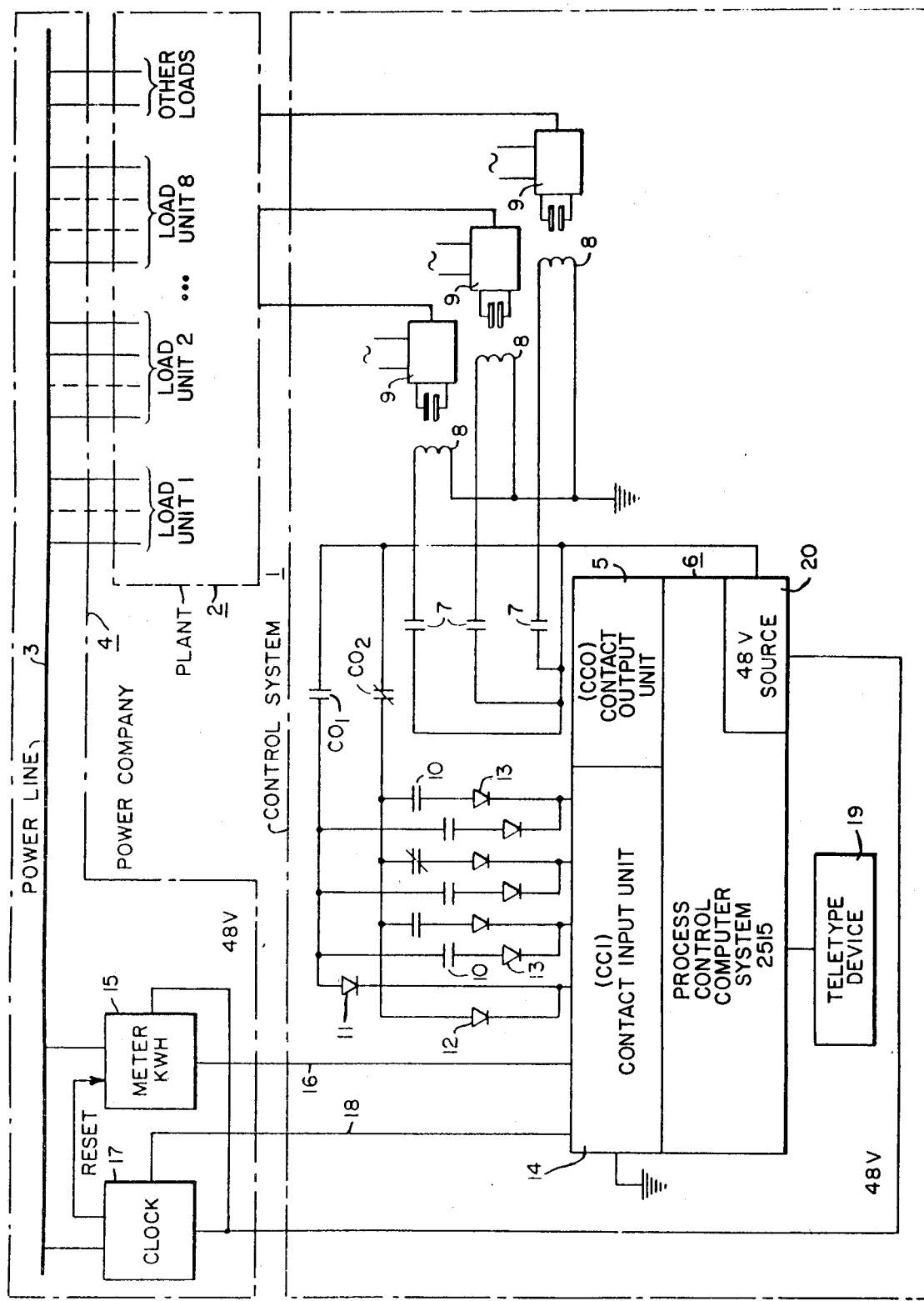
FIG. 2 is an overview of the control system used in a control system of the prior art for power demand control.

Referring to FIG. 2, there is shown an overview of a control system which may be used to implement the method according to the invention. The invention is applied to control of the loads of a plant 2 supplied with electrical power on the power supply lines 3 of a power supply. The loads are controlled by a contact output unit 5, which is part of the process control computer system 6. The contact output unit 5 does operate a plurality of load contact outputs 7, each of which closes the energizing circuit of a corresponding relay 8 to actuate the switching element 9 of a load. Such switching element may be the starter of an electrical motor, the plunger of the valve of a compressor, etc.

When a load is in the switched ON condition, a corresponding status contact interrupt 10 may be closed as shown on FIG. 2, with the contacts being arranged so as to correspond to the loads. There is shown in FIG. 2 illustratively a 'multiplex' scheme with two such groups of contacts with one group being associated with a diode 11 and one scan contact output CO1, and the other group being associated with a diode 12 and another scan contact output CO2. Respective diodes 13 are connected in circuit with corresponding status contact interrupts 10 to astablish a circuit from a 48 V source 20 provided by the computer system, to ground with the associated diode, 11 or 12. As shown on FIG. 2, concurrent closing of one scan contact output such as CO2 and one particular status contact interrupt 10, such as shown on the Figure, permits identification by the interrupt unit 14 of the status of the particular contact as being one of Group 2 (CO2 on the Figure).

In order to control the power demand by shedding or adding loads, the control system 1 is responsive to the power consumption continuously recorded by the meter 15 of the power supply company. The process control computer receives over a line 16 the KWH pulse which as a Δt characterizes the consumption at any particular instant within the demand period. The power supply company also provides a clock 17 which determines the beginning and the end of each demand period. In the instant case it is assumed that each such demand period lasts 15 minutes. For each turn of the disc of the meter 15 there is a pulse generated which will be hereinafter called "KWH pulse". The succession of these pulses represents on a time scale the energy consumed for one turn of the disc. The process control computer system 6 through the interrupt (contact closure input) unit 14 assesses the status of the status contact interrupts 10, and more generally, monitors all the input data fed into the computer system regarding the individual loads in the plant with their constraints, effectuates calculations, makes decisions which are converted, after each of the above-mentioned KWH pulses, into whatever load control action is necessary through the controlled operation of the relays 8.

Included as part of the control system 1, is the process control computer system 6. This computer system typically is a W-2515 under its trade name. It can be a digital computer system, such as a Prodac 2000 (P2000) sold by Westinghouse Electric Corporation. A descriptive book entitled "Prodac 2000 Computers Systems Reference Manual" has been published in 1970 by Westinghouse Electric Corporation and made available for the purpose of describing in greater detail this computer system and its operation. The input systems, associated with the computer processor are well known and include a conventional contact closure input system to effectuate scanning of the contacts or other signals representing the status of the equipment. Also, operator controlled and other information input devices and systems are provided such as the teletypewriter 19 shown in FIG. 2. The contact closure output system is also conventional and part of the Prodac 2000 general purpose digital computer system sold.

The computer method used in the control system according to the invention includes both Hardware and Software. For instance, the interrupt unit 14 is associated with an interrupt handler. Software is being used as a convenient means of quickly and efficiently performing operations as required in monitoring data, doing calculations, making decisions and translating treatment of information into control action within the short time intervals determined by the recurrent transmission of KWH pulses from the power supply company meter 15.

It is observed that the inputs consist of interrupts (internally generated via frequency scanned CCI's or external EI's) which are successively handled by the process interrupt handler. One interrupt will receive the 48 V DC pulse generated by the external clock and is used to reset the associated registers in the computer when it is received. Another interrupt will receive a train of 48 V DC pulses transmitted by the meter 15, each pulse representing KWH (or KVAH) consumed. Another interrupt could be reserved for a second KWH meter if needed. Three other interrupts (the scan contact interrupts 10 of FIG. 2) could be used to receive a status which corresponds to the status of one load contact in the plant and belongs to one group of three associated with one scan contact output (C01, C02 in FIG. 2). The units of production under control may be provided with individual power meters beside the main company meter.

The normal operator interface with the system will be via a teletypewriter 19. This device will also provide a log of system performance together with any other messages that may be required. Via the typewriter keyboard the operator will also be able to change the values of various constants relating to the system as a whole or to individual items of equipment. The time and date and on-peak and off-peak demand levels can also be changed using the same keyboard.

Having considered the Hardware aspect of the control system according to the invention, consideration will now be given to the software components of the computer system referring in particular to the flow charts of FIGS. 3A, 3B and 3C. The system will receive an interrupt from the clock at the beginning of each demand period together with a KWH pulse from the KWH (or KVAH) meter 15 for each revolution of the disc.

In response to a clock pulse the program puts out data to be printed out for the preceding demand period. All registers are initially cleared in which accumulated values are stored including time into period and KWH during the period. Prorated values of time and KWH are stored in those registers when the KWH pulse does not coincide with the clock pulse.

Figure 3A:
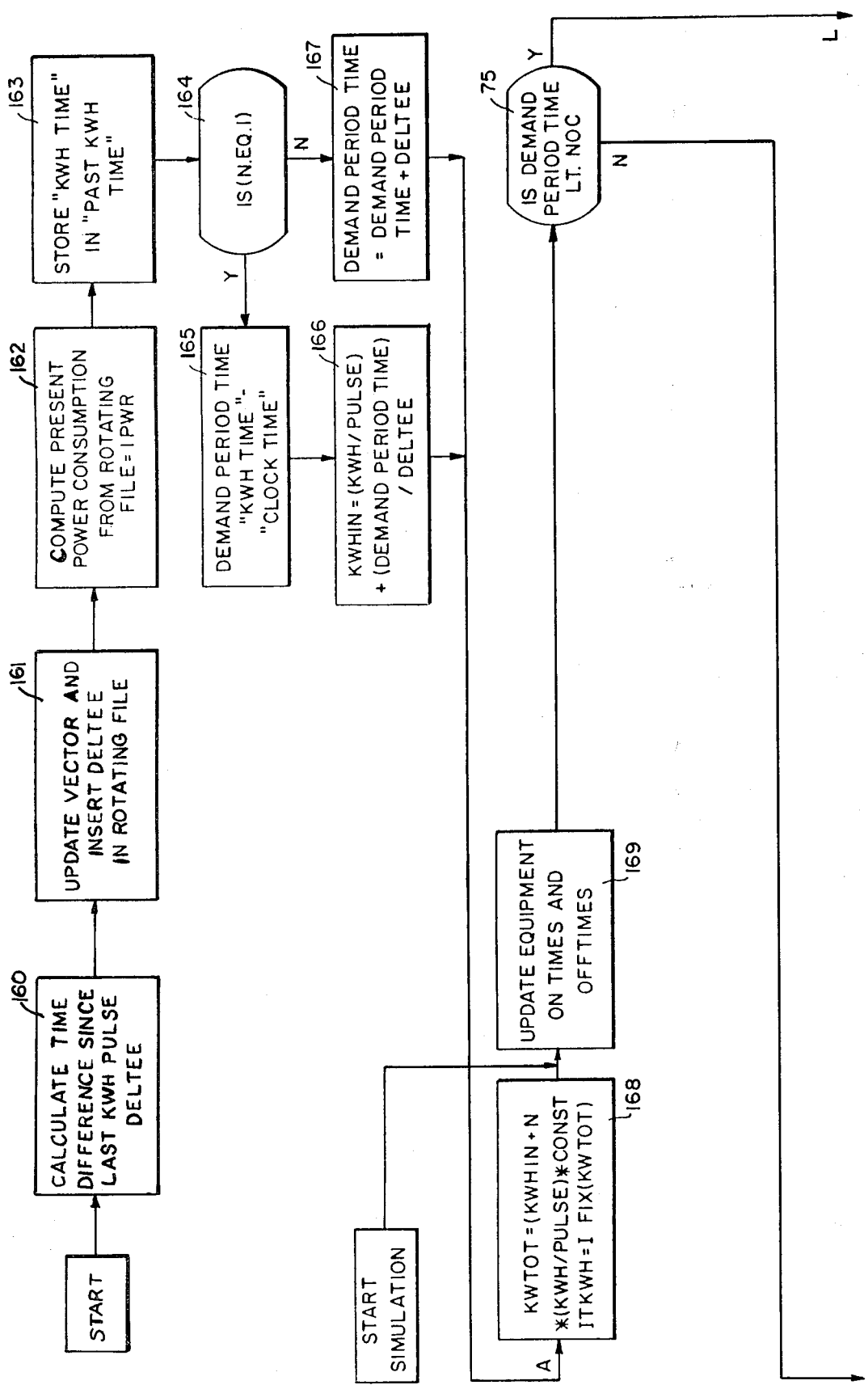
FIGS. 3A, 3B and 3C show an illustrative logic flow chart of a program of the prior art for power demand control.
Figure 3B:
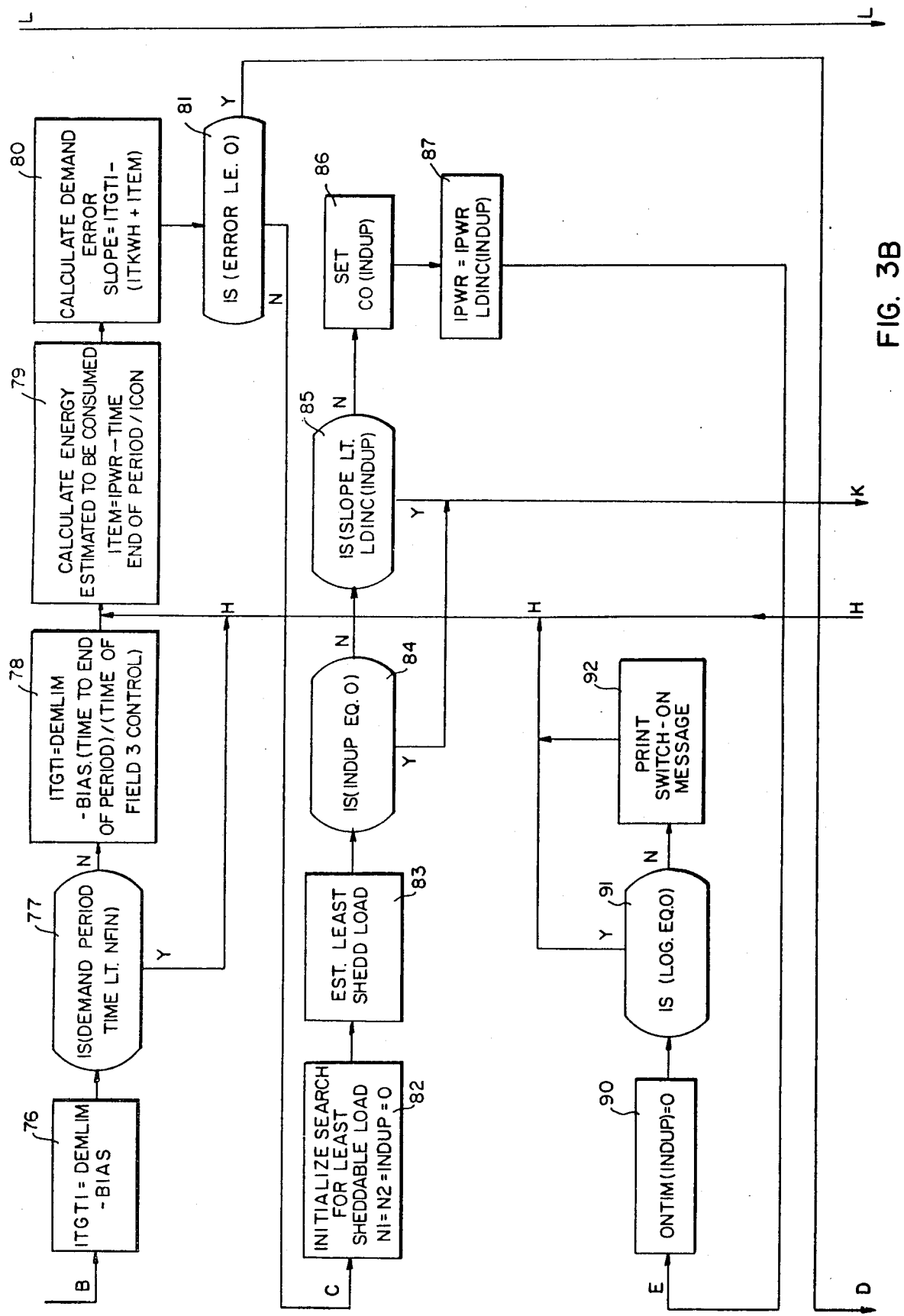
Figure 3C:
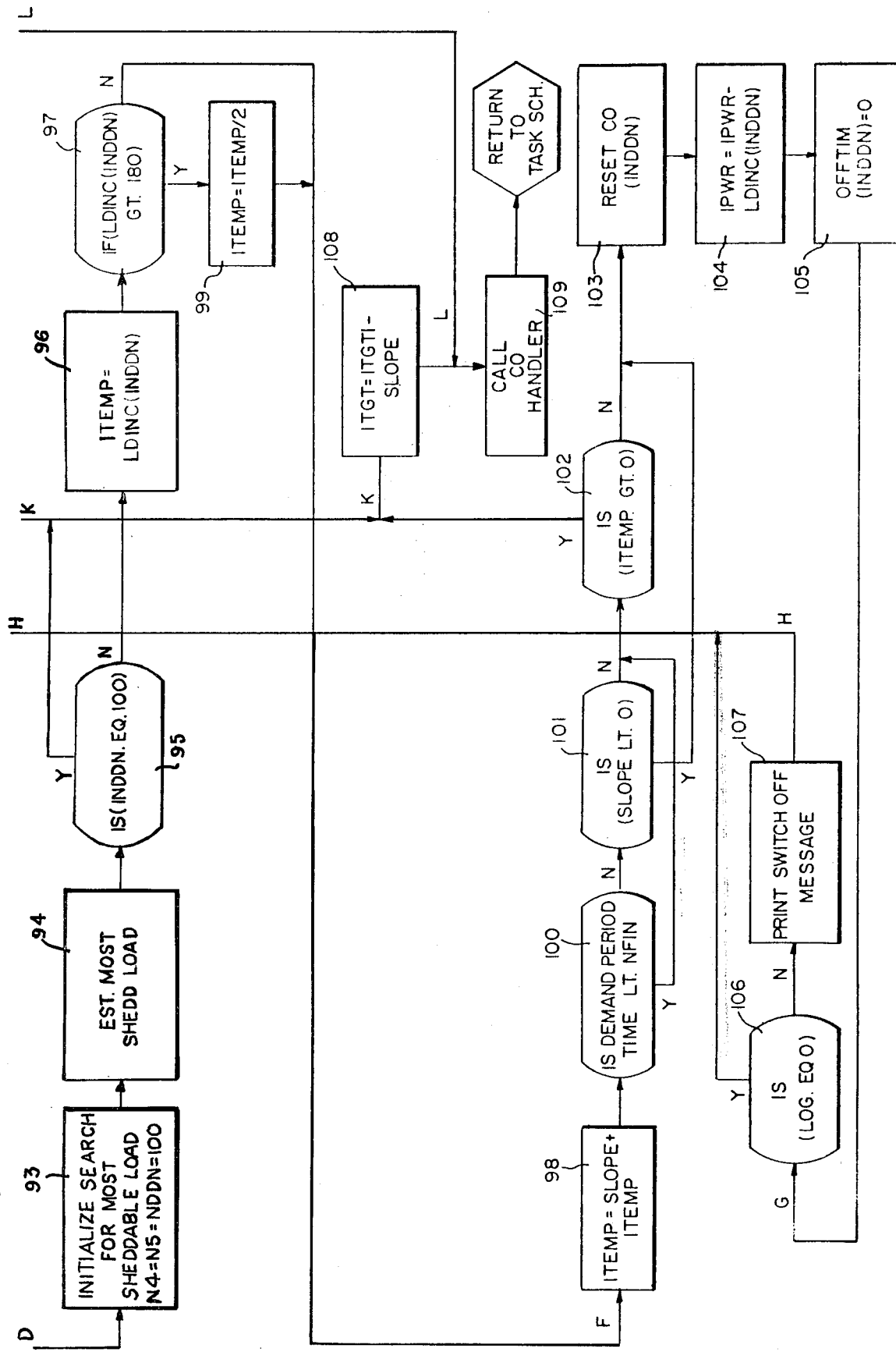

FIGS. 3A, 3B, 3C show a flow chart of the main control program, which is provided to explain the operation of the control system of the prior art, much of which is used in the present invention.

When control starts, "DELTEE" e.g., the Δt between two successive KWH pulses, is determined by difference. This is step 160. Then a rotating file is updated by adding the last of three successive vectors corresponding to three successive times $t_1$, $t_2$, $t_3$ ($t_3$ being for the latest Δt at step 161). At step 162, the present power consumption (IPWR) is computed from the rotating file, and from the present status IPWR is translated at step 163 into the "Past KWH TIME" register. At step 162 the present power consumed is calculated by averaging for three successive points on the trajectory corresponding to times $t_1$, $t_2$ and $t_3$. To this effect an exponential filter is used such as:

$$P_t = \left[ a \left( a \left( \frac{k}{t_1} \right) + (1-a) \left( \frac{k}{t_2} \right) \right) + (1-a) \frac{k}{t_3} \right] \quad (7)$$

where $0.1 \leq a \leq 0.4$, $t_1$, $t_2$ and $t_3$ are in hours and k=KWH/pulse.

It is recalled here that while each KWH pulse is received for the same increment of energy (one turn of the disc of the KWH meter), the "DELTEE" represents the power consumed within the period. The first is obtained by integrating the DELTEES corresponding to all KWH pulses received during the period. The energy consumed is equal to the number of pulses multiplied by the meter factor (KWH/pulse). The decision at step 164 (since N is normally greater than 1) is to go to step 167. However, the decision at step 164 is to go to 167 where the demand period time is found to be the sum of the Δt's in the period.

The DELTEE corresponding to the first pulse after the clock pulse (N=1) belongs in part to the last demand period and only in part to the new demand period. In such case, the decision at 164 is to go through steps 165 and 166 which provide a prorated value of the KWHIN in proportion to the fraction of DELTEE pertaining to the new demand period. Accordingly, step 165 provides the time difference between KWH Time and clock time, and at step 166 the prorated value KWHIN is computed.

Looking to A on FIG. 4A, the next step is to compute KWTOT, e.g., the energy consumed during the present demand period until the particular iteration, converted to equivalent power at the end of the period. KWTOT is equal to N (number of pulses) *KWH/pulse *Constant plus the fraction prorated at step 66, if there is one, e.g., KWHIN. If the computation is done with a floating point for increased accuracy, conversion to integer is required as indicated by ITKWH=IFIX (KWTOT), see (168).

Then, at step 169 the system looks at the status of the ON times and OFF times of the loads, while adding the Δt (DELTEE) and it is determined at step 70 whether any load exceeds the OFF time assigned to it. In such a case, a decision is made at 70 to set the contact output to switch the particular load ON (step 71) thereby not to violate the constraint. Since the load has been switched ON, the ON time of this particular load is set to zero (step 72). Also, the energy estimated to be consumed in the overall industrial load system (IPWR) must be updated in order to take into account the load so picked up.

Figure 4:
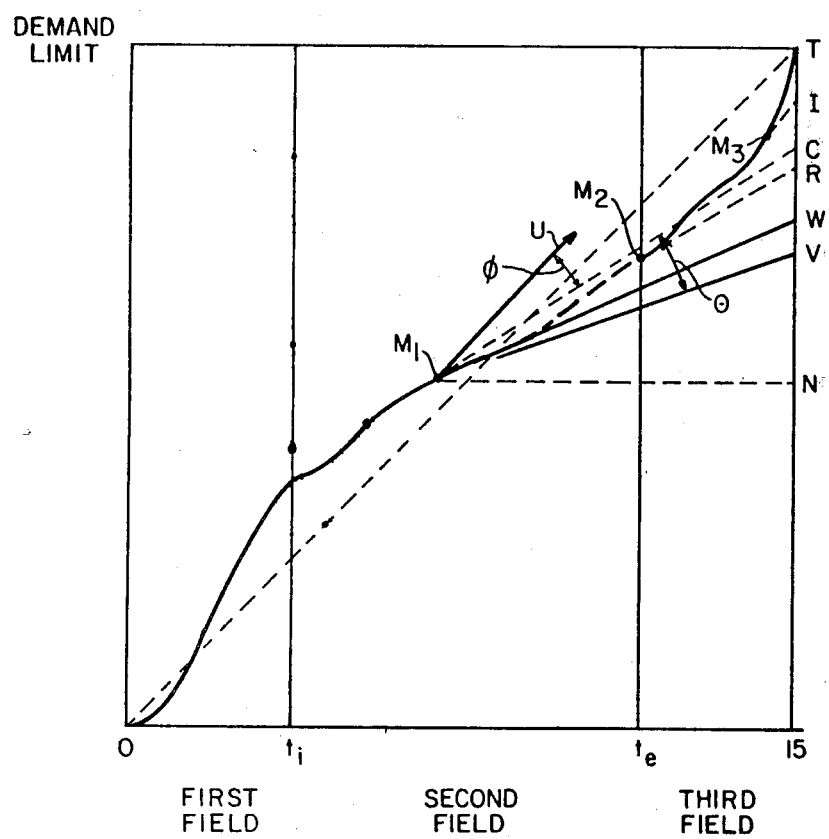
FIG. 4 is a diagram showing a typical strategy of control used for power demand control in the prior art.

The next decision is at 75 depending upon whether the system is under a first field shown from 0 to $t_i$ in FIG. 4, e.g., a first portion of the demand period for which no control is effected (NOC). When the first field terminates, the second field begins which is a field of control, namely at B after step 75. If in response to the decision 75 the control system operates in the no control condition (NOC), the system goes to 109. As a result, the contact output handler will ascertain the status of the contacts. Considering now the chain starting at B for control operation, the second field of control (from $t_i$ to 15 minutes) will be explained by reference to FIG. 4. C represents a pseudo-target defined by a bias (BIAS) during the second field of control, T represents the true target corresponding to the desired Demand Limit (DEMLIM). The target (ITGTI) in the second field as represented by C is: DEMLIM-BIAS. The control system (FIG. 4B) is set accordingly at step 76. Being in the second field, the flow chart goes from 77 directly to step 79. If a third field is required, at step 78, according to the Putman patent, the BIAS is reduced at each iteration until the end of the period. Accordingly, a fraction is used to reduce the BIAS by a ratio between the time left in the period and the duration of the third field. This amounts to a displacement of the target for each point on the trajectory. At steps 79 and 80 the demand error is calculated. ITGTI represents the ordinate of the target (C in the second field, I in the third field, T at the end of the demand period). The ordinate of N (see FIG. 5) is ITKWH obtained at step 168. The ordinate of W is ITKWH+ITEM (e.g., WN). Therefore, the error due to W being too low, or too high, relative to the target is Slope=IGTI−(ITKWH+ITEM). First, at step 79 ITEM is calculated, using data obtained at step 162 (IPWR=present power consumption), and computing the second term in equation (3), e.g., $P_t (T_{max}-t)$. Knowing ITKWH and ITEM, the demand error is calculated at step 80. Then the sign of the Y or N at 81 will tell whether the projected point W lies above or below the target. If it is above, the error is negative and loads have to be switched OFF. The flow chart goes to D. If point W lies below the error is positive and loads must be switched ON. The flow chart goes to C.

First, the situation when the error is positive will be considered by taking the flow chart from C on, in order to find (1) whether there is a load to be switched ON, (2) whether a selected load can be switched ON by step 86.

The computer system then first looks for a load in accordance with a table of priorities. Step 82 initializes a search for the least sheddable load, and provides for indexation of the priority order ($N_1$) and of the subpriority order ($N_2$) for a load to be switched ON (INDUP). At step 83 the search is established accordingly. If the search has not provided at least sheddable load, the decision at step 84 is to go to K, e.g., a no control drain leading to a bid for the CO handler at 109. At step 109, the projection W on the final ordinate of the tangent from the point M on the trajectory (see FIG. 4) is determined as ITGT by the difference between the target and the error. Such information can be conveniently logged for the following reason. ITGT=Ordinate of target (C, if in the second field of control)−error (CW). This is the way ITGT is determined at step 108. But ITGT is also equal to: WN+ordinate of N (see FIG. 4). Since WN=ITEM and ordinate of N=ITKWH, both known by steps 168 and 79, then ITGT is known from previous computations. However, when late in the demand period ITEM becomes very small, therefore a log of ITGT provides a value which tends to be ITKWH equal to the final demand at the end of the demand period.

At step 109 the CO handler of the computer is called upon to check the contact outputs and there is a return to the task scheduler of the computer system.

If, however, a load to be switched ON has been found (NO at 85), (INDUP) the deadband according to the Putman patent is put into effect at step 85. If the deadband (LDINC) includes vector MW, then no control is effected (YES at 85) and the flow chart goes again to K (again a log of ITGT and a bid for the CO handler). However, if there is a NO at 85 then MW is outside the deadband (LDINC), control is possible and action is bid at step 86. At step 87 the new present power consumed IPWR is calculated by including the added power LDINC and due rotation is effected within a group of loads at step 89 if the load is one of a group.

Having called for the load to be ON, the ON time (ONTIM) for the particular load (or for the rotated group of loads if steps 88, 89 are followed) is initialized at 90 (E), while at step 91 a decision is made to print the "Switch-On" message (92) if the control operation requires it.

Considering now the decision at 85 to switch a selected load ON (if N) or not to switch (if Y), the error CW (FIG. 4 for second field of control) is compared with the increase of power LDINC expected. Control will occur only if LDINC is less than the error. If the selected load can be switched (85), the control action is determined at step 86 and the increased amount of power is accounted for in the new IPWR (step 87). Having called for the load to be ON, the ON time (ONTIM) for the particular load (or for the rotated group of loads if steps 88, 89 are followed) is initialized at 90 (E), while at step 91 a decision is made to print the "switch-ON" message (92) if the control operation requires it.

When the demand error (81) is negative a load must be switched OFF because ITGT is above the target. In such case, the flow chart goes to D (FIG. 3C). Steps 93 and 94 correspond to the steps 82, 83 encountered at C for the positive demand error. The search here is for the most sheddable load, thus from the opposite end of the table of priorities and subpriorities ($N_4$, $N_5$) as opposed to steps 82, 83 for ON switching. When no load to be switched OFF is found, the program indicates an index of 100 as a flag. If this is the case, the flow chart goes to K, and no control is exercised as previously indicated with respect to steps 108, 109. If there is such a load (INDDN), the decision (95, N) is to test the relation of LDINC (the correlative decrease of power if the particular load were effectively switched OFF) to ITEMP which determines the deadband. Two situations happen at this stage depending upon whether the load exceeds 180 KW (Y) or not (N) and the decision is made at 97. If it is a Y, ITEMP is made half of what it is at step 96. In other words, 96 can be read as making the deadband ITEMP=LDINC and 99 as making the deadband ITEMP=½LDINC. Assuming 97 leads to N, then ITEMP is made equal to LDINC. This means that at step 98 the slope (CW if in the second field) which is negative is in fact subtracted from LDINC. This difference is a residual error sign of which (in the second field 100 goes to 102) is checked for decision at 102 to control (103) or not (108) switching of the particular load. Again, if the vector or W is within the deadband (between MV and MC), there will be no control. If MW is outside the deadband, then the load will be switched OFF. If control is in the third field (101) then the system merely looks to the error (negative here) to switch (Y) or not the load OFF.

Once a load is shed (at step 103) the present power IWPR is updated (104). At step 105, the OFFTIM (computed off-time of the load) is updated at each iteration. A decision is made thereafter to log the information (step 106) and to print a switch-OFF message (step 107). After each control operation (shedding or pickup), the energy estimated to be consumed is estimated (at step 79) and the demand error is again calculated in order to establish whether a new load should be switched ON (at C) or OFF (at D).

Once counting of time and power consumption has started for a given demand period, a first field is established during which the load system is left to itw own constraints without control (75, IO8, NOC). Since there is no control, the slope varies only with the loads. There is no need for a calculation of the slope at any point of the trajectory. Although there is no control during the first field, the status of certain of the interruptible loads may have changed during that time. For instance, the operator may have introduced a new load, or a load could have reached the end of the production process. According to step 70, the contact output of such load would have been set in one case, or reset in the second instance (71). Therefore, the control system calls for the CO handler which is the software counterpart of the contact unit 5 (FIG. 2). Thus, a bid is made (109) for the CO handler in order to implement the status of the contact outputs established by the previous iteration.

The system then returns to the task handler. The first field ends at time $t_f$ (FIG. 4) and the second field is established thereafter (N,75). The invention will be now considered in this particular context, and the preferred embodiment will be described herebelow and illustrated as a power demand limit control method applicable to control of arc furnaces in a plant.

DESCRIPTION OF THE STEPS OF THE METHOD ACCORDING TO THE INVENTION BY REFERENCE TO THE OPERATIVE CONDITIONS OF THE CONTROL SYSTEM OF U.S. PAT. NO. 3,872,286.

Figure 5:
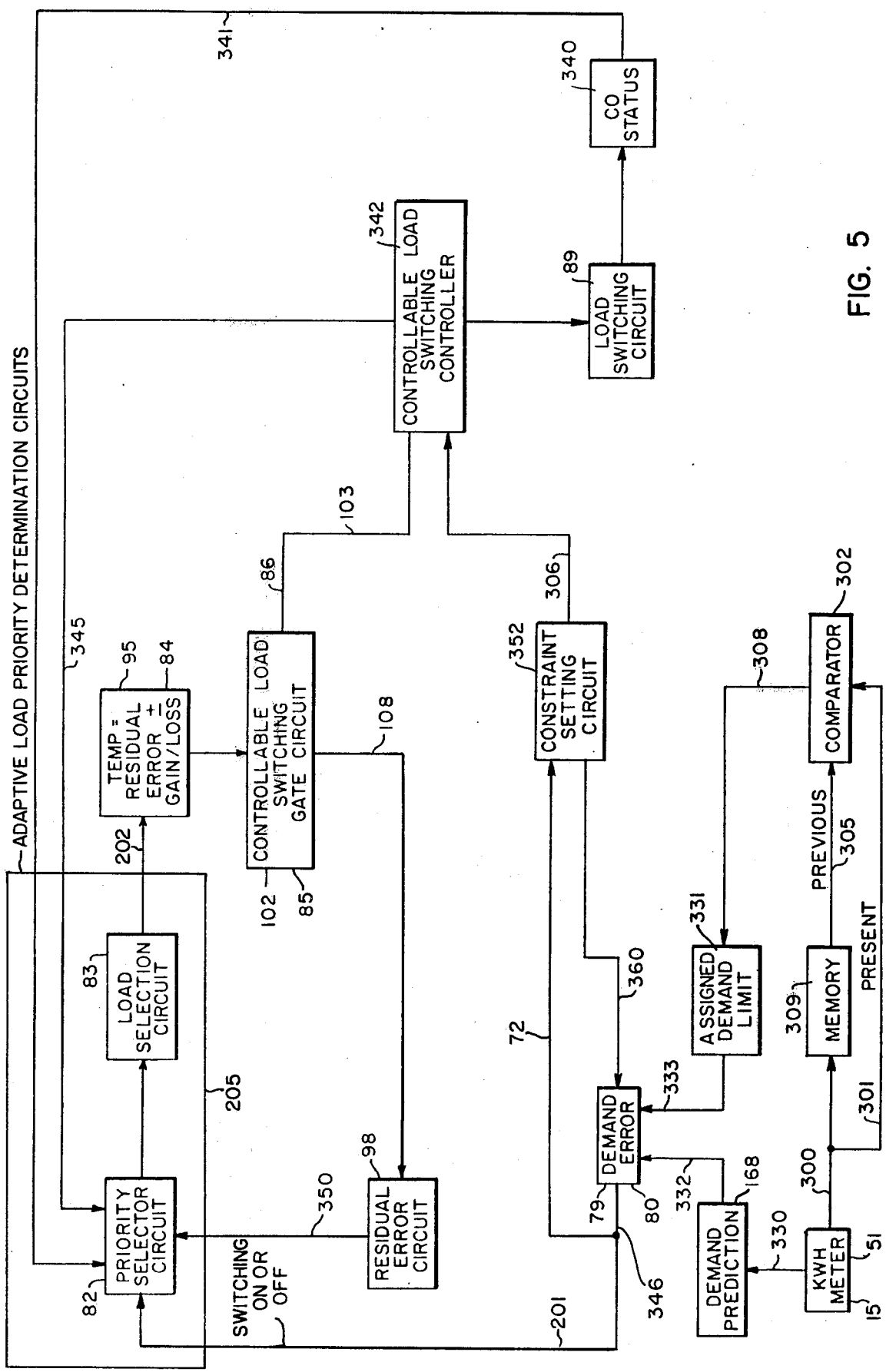
FIG. 5 is a diagram showing control of units of production in accordance with the present invention.

Referring to FIG. 5, a diagrammatic representation of the organization of the control method according to the present invention is provided in the context of the power demand control system of U.S. Pat. No. 3,872,286, first described. The main functions used are indicated on and identified by blocks, all blocks which have already been explained by reference to FIGS. 3A-3C have been referred to by the same reference numerals wherever found in those early figures.

The KWH meter (15, 51) of the power company provides on line 330 an indication of the energy consumed every time the wattmeter has completed one revolution. As explained hereabove by reference to FIGS. 1 and 4, the slope of the tangent at the operative point (M, $M_1$) on the demand curve (OM, $OM_1$) indicates the wattage. This slope is used to extrapolate to the end of the 15 minute demand period. The extrapolation by the demand prediction block 168 estimates the segment NC (FIG. 4) supported by tangent $M_1C$. The error CT established by reference to the assigned demand limit is calculated by demand error block 79, 80 which is responsive to signals on lines 332, 333 from the demand prediction block 168 and the demand limit block 331, respectively.

Turning now to the right side of FIG. 5, the load switching circuit 89 represents an array of individual switches such as (8, 9) in FIG. 2. A CO status circuit 340 communicates the switching of loads on line 341 to the adaptive load priority determination circuits 205 which include a priority selector circuit 82. The load switching circuit is controlled by load switching control circuit 342, affected to controllable loads. The controllable load switching controller 342 is gated by controllable load switching gate circuit (102, 85) from lines 86, 103, whenever switching of the particular load is permitted.

Selection of a controllable load results from affirmative decision in an error circulating loop comprising residual error circuit 98, priority selector circuit 82 (as affected by the status of the contacts CO from line 341) and the effective successive earlier operations of the controllable load switching controller 342 (as reflected by gate circuit 102, 85 and via line 108 into priority selector circuit 82 in a controllable load controlling loop). The error is recirculated in a loop from priority selector circuit 82 into a load selection circuit 83 which is part of the adaptive load priority determination circuits. This loop provides a tentative computation of residual error and gain (or loss) in 95, 84, which is the calculation of TEMP. As a result of such calculation the controllable load switching gate circuit (85, 102) will either allow, or not allow, switching. The error circulating loop closes via line 108 on the residual error circuit 98, which in turn may cause another scanning of the priority selector circuit 82 for another iteration. The demand error derived on line 346 establishes the priority selection in priority selector circuit 82 preliminary to residual error determination. As a result, the determined power gain or loss due to the switching of a prospective controllable load by 342 and 89, is first translated via 45 into the priority selector circuit 82, then subtracted from the predicted demand error on line 346 thus providing a residual error on line 350, thereby to cause a search for an available load by scanning through the priority selector circuit 82.

The demand error takes into account not only the prediction of the demand (168) at the time and the demand limit (331) assigned for the particular demand period but also the constraints which have been exercised in the meantime by the constraint exercising loop which is effective on the production and non-production loads having a constraint. As earlier explained, the constraints when exercised may cause a load to be inhibited from switching for instance if a furnace has reached the end of the heat, or become available for switching if for instance a furnace out of production has become available to start heat. After a demand error has been determined on line 346, and before any calculation of the residual error by block 98, the constraints are exercised via line 72 onto the load constraint setting circuit 352. Block 352 establishes the preset constraints for the loads of the controllable type, e.g. onto controller 342. The load switching circuit 89 will effect switching of the selected controllable loads and assume the constraints of the non-controllable loads, accordingly. In common to all the production loads, or arc furnaces, is provided an adaptive load priority determination circuit 205 schematized for the sake of simplicity by a single block. This block appears in FIG. 6 with corresponding signal carrying lines (such as 350, for the residual error circuit 98, 202 for the TEMP circuit (95, 84) and 201 from the demand error circuit 79, 80 of FIG. 5) entering or leaving block 205.

Figure 6:
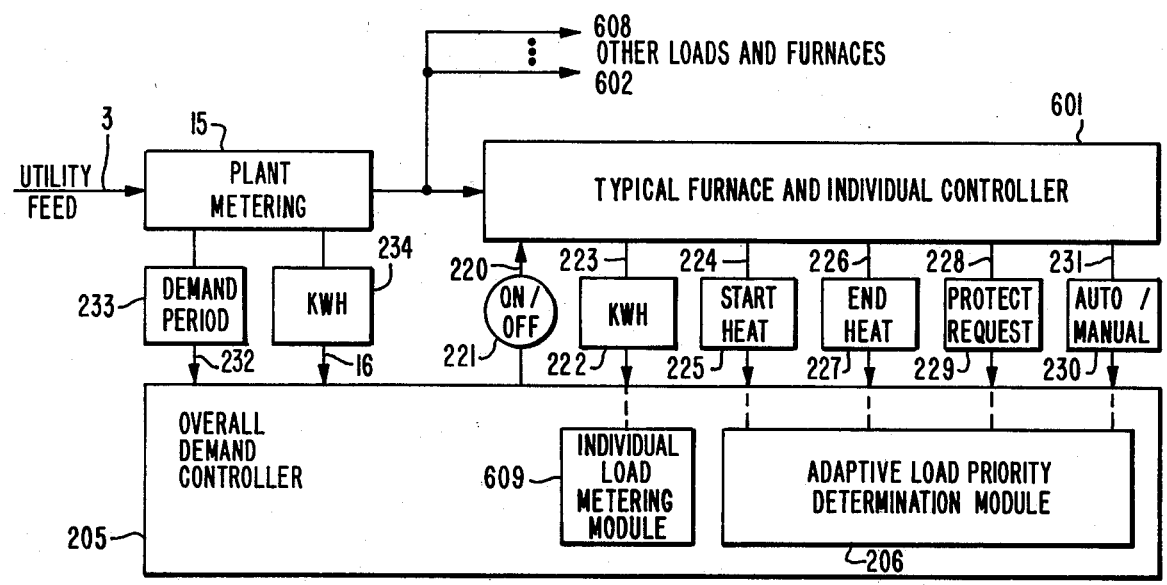
FIG. 6 shows the interface of the control circuits of the units of production with the power demand control circuit of FIG. 5, corresponding to FIG. 2 for the prior art.

With reference to FIG. 6, energy is received on power line 3 to the plant which typically includes eight furnaces 601–608, each having its individual controller. The KWH meter of the company (15) provides a signal indicative of the demand period (15 minutes). Meter 15 also provides the KWH indication. Each furnace has its individual meter (for instance, 222) and a KWH pulse provides the KWH signal to an individual load metering module within the system 205. A number of other signals are applied to the adaptive load priority determination module 206 within system 205. The control signals applied to circuit 205 of FIG. 6, mainly are process inputs or outputs in ON-OFF form which are used logically determine the priority order of the production units, and the order of storage for power demand control within the three memories I, II or III of FIG. 8.

The signals of FIG. 6 are as follows:

(1) For each production unit, such as unit 601, circuit 205 has a means to switch ON, or OFF, the particular load. On FIG. 6, line 220 is the controller output line to the ON/OFF control means of furance 1, and 221 is the contact closure (such as C01 in FIG. 2) for the selection of the load.

(2) Then, there is a pulse from an individual KWH meter 222 derived for load 1 via line 223. This signal provides an indication of the actual energy usage by the individual furnace, such information being used in the calculations leading to decisions, within the context of the Putman patent technique, involving load 601, to be shed, or added to the overall plant consumption within the control period. 224 represents the individual load metering module within controller 205.

(3) The reset signal is "Start Heat" derived from Furnace 1 (601) on line 224 to controller 205. It represents the status of a contactor (225) indicating whether there is a request to start heat. In the true state this signal means that the operator wants this load to be ON.

(4) While the manufacturer normally applies control to the furnace in accordance with a particular heating process, operation of the particular furnace comes to an end when the heat has been completed. A signal indicating whether the load has terminated its operation is derived on line 226 from the furnace controller. This signal represents the status of an "End Heat" indicator 227. After an "End Heat" the load is out of consideration for power demand control, as if it never existed, until a "Start Heat" request is received.

(5) As earlier mentioned, a load may be given preference by the operator over all the other loads to be ON. Such load status has been referred to as a "protected" status. Accordingly, from the furnace control a signal is provided on line 228 to the controller 205 which is indicative of the state of a switch 229 ON when a "protect" request has been made for the load.

(6) The operator may want to take one particular furnace out of operation under its automatic control circuit. Therefore, an "Auto/Manual" switch is provided to indicate via line 231 to controller 205 whether the load is available for control by the power demand limit control system. Even though the furnace may be on manual, it is still possible that the load will add wattage as data for evaluation of the demand error by the control system, either through the overall KWH meter 15 or the individual KWH meter 222.

(7) The system is arranged to respond only to alternate Start Heat and End Heat signals (224, 226 on FIG. 6), ignoring multiple signals of the same type from the same load.

(8) The ON/OFF CCO signals (221 on FIG. 6) may actually be used to lower (ON) or raise (OFF) electrodes into/out of the furnace, thereby controlling furnace power.

Otherwise, the controller 205 responds to the KWH meter 15 of the utility company from which is derived the wattage via line 16 (as in FIG. 2) and the clock establishing the demand period (for instance of 15 minutes) via line 232. The controller 205 (FIG. 6) thus responds to the logic of all input signals of lines 232, 16, 223, 224, 228 and 231 and generates on line 220 a control signal to shed or to add the particular load, or production unit, to the overall load system.

Figure 7:
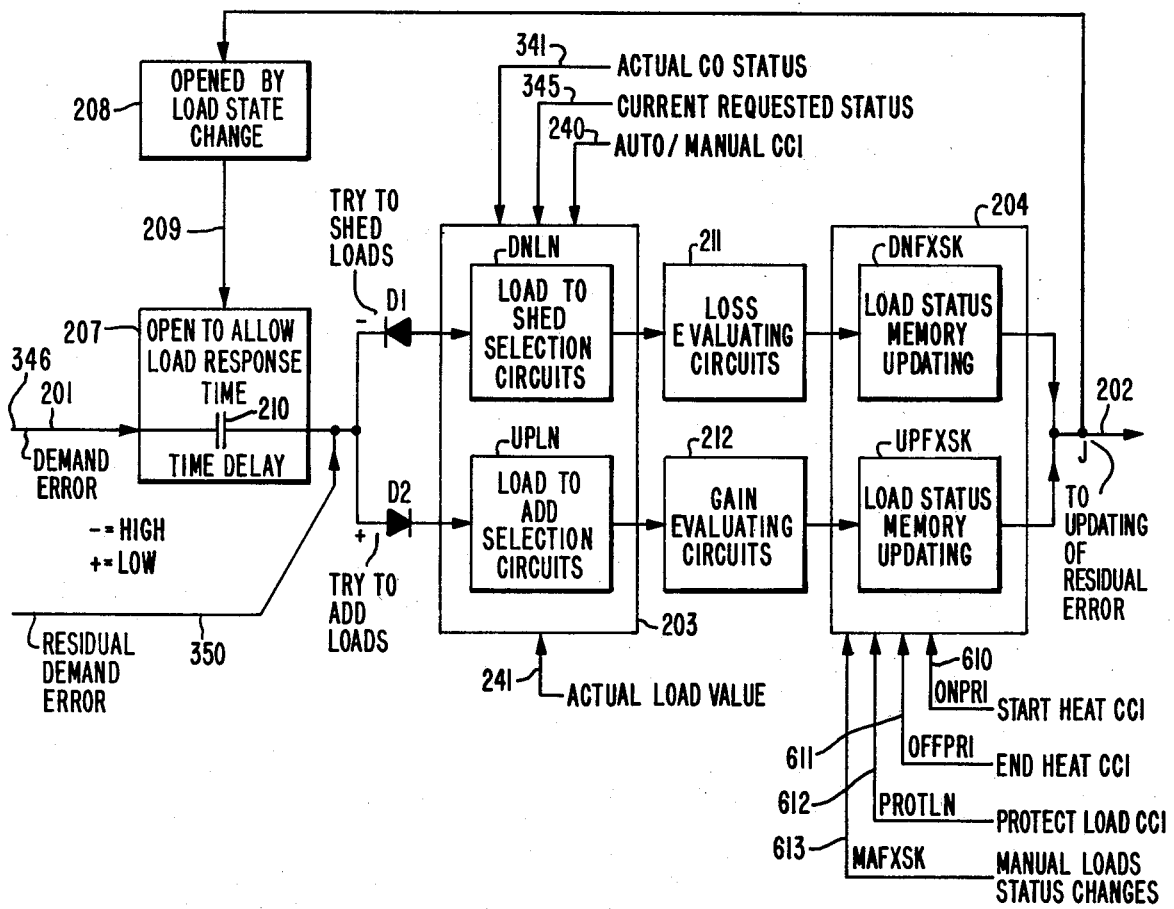
FIG. 7 is a schematic representation of the functional steps used in FIG. 5 and FIG. 6 to select units of production for control under the power demand control method according to the invention.

Referring to FIG. 7, there is further shown specific circuitry involved in carrying out the control required in accordance with the present invention. FIG. 7 though should be considered together with FIGS. 5 and 6 since FIG. 7 shows in detail the particular internal arrangement of the adaptive load priority determination module 206 which is a main part of the circuits 205 of FIG. 6. The entirety of FIG. 7 is also shown as block 205 (containing blocks 82, 83) at the upper left-hand corner of FIG. 5. FIG. 7 is a more exact breakdown of the contents of FIG. 5's block 205 than is shown in FIG. 5. On line 201 from circuit 79, 80) of FIG. 5 the demand error is fed to one of two channels, depending upon whether the error is positive or negative, e.g., whether corrective control requires to shed (too high consumption) or add (too low consumption) loads, namely, furnaces. Such signal of line 201 is passed through a time delay circuit 207 in the form of a path opened for a definite time at any load state change (see circuit 208 gating via line 209 the state of contact 210; 208 has a definite active time). At the entrance of the two channels via line 350, the residual demand error loop closes an earlier explained in relation to FIG. 5. Diodes $D_1$, $D_2$ are used to select one channel or the other, depending upon the polarity applied to the diodes. Each channel can be read on FIG. 7 in terms of the diagram of FIG. 5. For instance, the negative channel includes a circuit DNLN for the selection of loads to shed, whereas the positive channel includes a circuit UPLN for the selection of loads to be added. Circuits DNLN and UPLN together are equivalent to both the priority selector circuit 82 and the load selection circuit 83 of FIG. 5. This will appear more clear from a consideration herebelow of how the priority order of the loads is changing during the industrial process represented by the loads, whereas in the instance of the Putman patent, priority was assigned to the loads in advance according to their nature, and by choice of the operator.

As a result of the selection mode in accordance with the demand error in each channel, a gain or loss evaluating circuit establishes a residual error which through a loop such as 108, 98 is received via 350 at the entry of the main loop ($D_1$ or $D_2$). A loss evaluating circuit 211 is effected to the negative channel at the output of circuit DNLN, whereas a gain evaluating circuit 212 responds to the selection circuit UPLN for the positive channel. The outputs of circuits 211 and 212 are fed respectively to a load status memory updating circuit DNFXSK and to a load status memory updating circuit UPFXSK. The residual error loop closes from DNFXSK or UPFXSK into TEMP=Residual Error±gain/loss as explained earlier by reference to circuit (84, 95) of FIG. 5.

Figure 8:
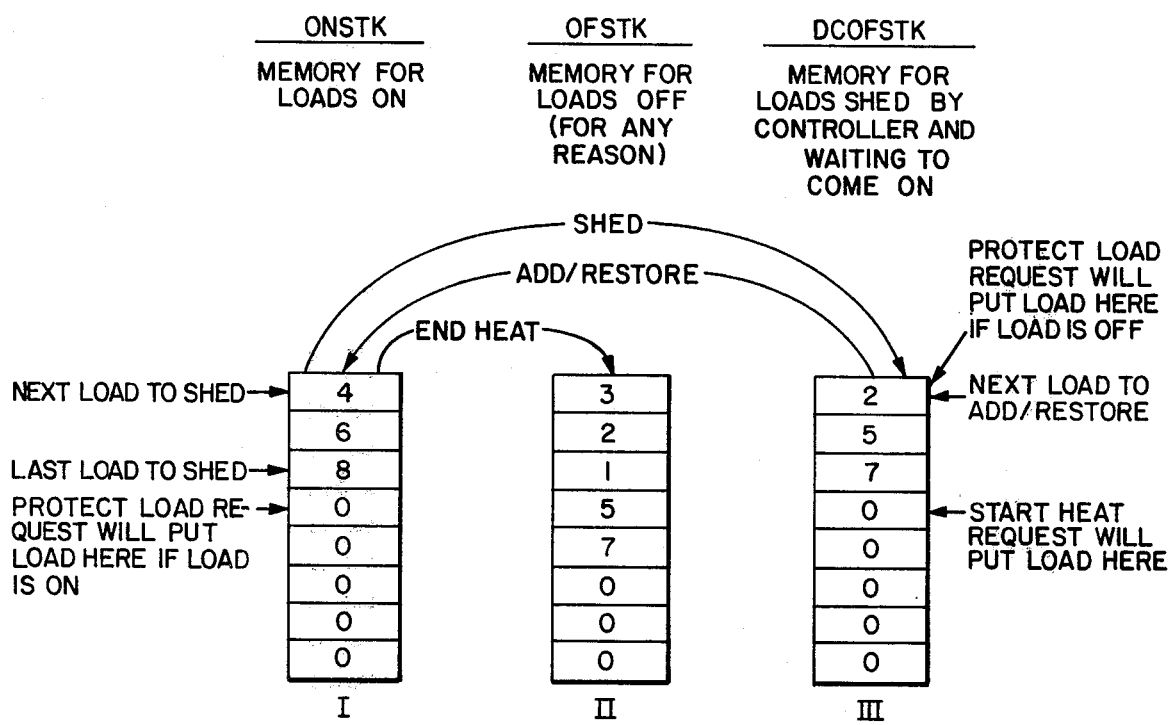
FIG. 8 is a schematic representation of the load status memory scheme referred to in FIG. 7.

From junction J at the output of the two channels to line 202, the controllable load switching gate circuit (102, 85 on FIG. 5) is activated in accordance with the selection found acceptable and to become effective. Several gating signals are applied to the load selection circuit 203 (which comprises DNLN and UPLN) or to the load status memory updating overall circuit 204 (which comprises DNFXSK and UPFXSK). These gating signals will be considered after a consideration of FIG. 8 representing the state of the memories involved in the priority organization of the control method according to the invention, which memories are to be found within circuit 204 of FIG. 7. The explanation given by reference to FIG. 8 will provide a basis for an understanding of the operative mode of the adaptive load priority determination circuit 205 of FIGS. 5 and 206 of FIG. 6.

FIG. 8 represents three memories—Memory I, Memory II and Memory III, which are in the form of randomly accessible shift registers. It is assumed that the plant includes 8 arc furnaces, numbered from 1 to 8. Memory I represents the priority order of the loads which are ON. The first location indicates that loads Nos. 4, 6 and 8 are ON. They are in this order in the memory. According to the established rule of priority, the load at the first location at the top is the next load to be shed, namely 4, whereas load No. 8 is at the bottom of the pile, thus the last load to be shed. Whenever circuit DNLN looks for a load to be shed, it will look into Memory I and will take the available loads in the order illustrated by FIG. 8.

Memory III represents the loads which have been shed by the controller, thus loads which are waiting to come ON. The highest priority to be added is load No. 2 at the first location. Then comes load No. 5. At the bottom of the list is load No. 7. Thus, whenever circuit UPLN looks for a load to be added, it will take the loads which have been indicated as available by Memory III, from the top thereof in the order indicated by FIG. 8. It appears that during exercise of successive control operations loads may be taken from one memory (I or III) and passed to the top of the other (III, or I), depending upon whether in accordance with the required demand limit, load is to be added (its number is added at the top of Memory I and all the others shift downward by one location) or shed (its number is added on the top of Memory III and all the others shift downward by one location). As a result of such selection, while a load is added on one memory, it is taken out from the top of the pile in the other memory (as shown by the arrows of FIG. 10) and the rest shifts up by one. FIG. 8 shows, between Memories I and III, a Memory II which indicates loads which are OFF from production for any reason. In the illustration shown, these are 3, 2, 1, 5 and 8 in this order from the top. It is noted that at the end of the heat a load leaves a register in Memory I (or III) to occupy the highest location in Memory II but not in Memory III. In other words, the loads in Memory II are in the order of the last to reach the end of the heat. If a heat is to be started on a furnace, the furnace to become operative becomes in effect the first OFF and ranks last in Memory III, therefore, after any of those who had been ON and were shed by the controller.

Memory I is identified as ONSTK, Memory II as OFSTK and Memory III as DCOFSK. The control method also provides, in accordance with the present invention, for giving preference to a given furnace to be turned ON, or remain ON by causing a load to be "protected." A protected load's number will be stored, if ON, at the bottom of Memory I, thus giving it the last chance to be shed, while it will be stored, if OFF, at the top of Memory III, thus making it first to be added from Memory III to the top of Memory I. With this understanding the discipline of control is as follows:

1. Loads are shed from top of ONSTK to top of DCOFSK.
2. Loads manually turned OFF go onto top of OFSTK (including those ending heat).
3. Loads are restored from top of DCOFSK to top of ONSTK.
4. Loads starting heat go into the bottom of DCOFSK (for automatic transfer to ONSTK when appropriate).
5. Protecting an 'ON' Load moves it to bottom of ONSTK (last to be shed).
6. Protecting a Load that is "OFF" because it was shed by moving it to the top of DCOFSK (next to be added).

Referring now to FIG. 7, the input process and output process signals just considered, will be considered again in relation to the specific circuitry of the adaptive load priority determination module 206, within controller 205, of FIG. 6.

As inputs to circuit 203, it is recognized from FIG. 7 that on line 341 (the same as in FIG. 5) a signal is provided representing the CCO status (see 340 in FIGS. 5). Then, on line 345 (the same as in FIG. 5) the status requested in the decision making process is provided. The "Auto/Manual" status of the load is provided via line 240. Finally, via line 241, circuit 203 is supplied with a signal representing the actual load value. It is observed in this respect that effective control of the particular load will depend upon how such value is defined during the production process. For instance, in the aforementioned U.S. Pat. No. 3,602,703 of Polenz, typically consumption by an arc furnace is assumed to have three phases at three different levels. Depending upon the progression of the production process the load would, in such instance, represent three different values in the load system of the plant. It is also reminded here that circuit 203 corresponds to circuits (82, 83) of FIGS. 5.

Considering now circuit 204 of FIG. 7 used for updating the priority table in the Memories I, II and III of FIG. 8, four earlier-mentioned signals are there provided.

(1) A "Start Heat" CCI signal energizing a function ONPRI at 610.

(2) "End Heat" CCI signal energizing a function OFFPRI at 611.

(3) "Protect Load" CCI signal energizing a function PROTLN at 612.

(4) "Manual Load" status changes accounted for by the function MAFXSK at 613.

The functions ONPRI, OFFPRI, and PROTLN adjust the contents of the memories I, II, and III due to external start heat, end heat, and protect load CCI's respectively. The functions UPFXSK and DNFXSK adjust the contents of the memories I, II, and III due to loads being restored or shed respectively. The function MAFXSK adjusts the contents of memories I, II, and III due to loads being manually turned ON or OFF.

Figure 9:
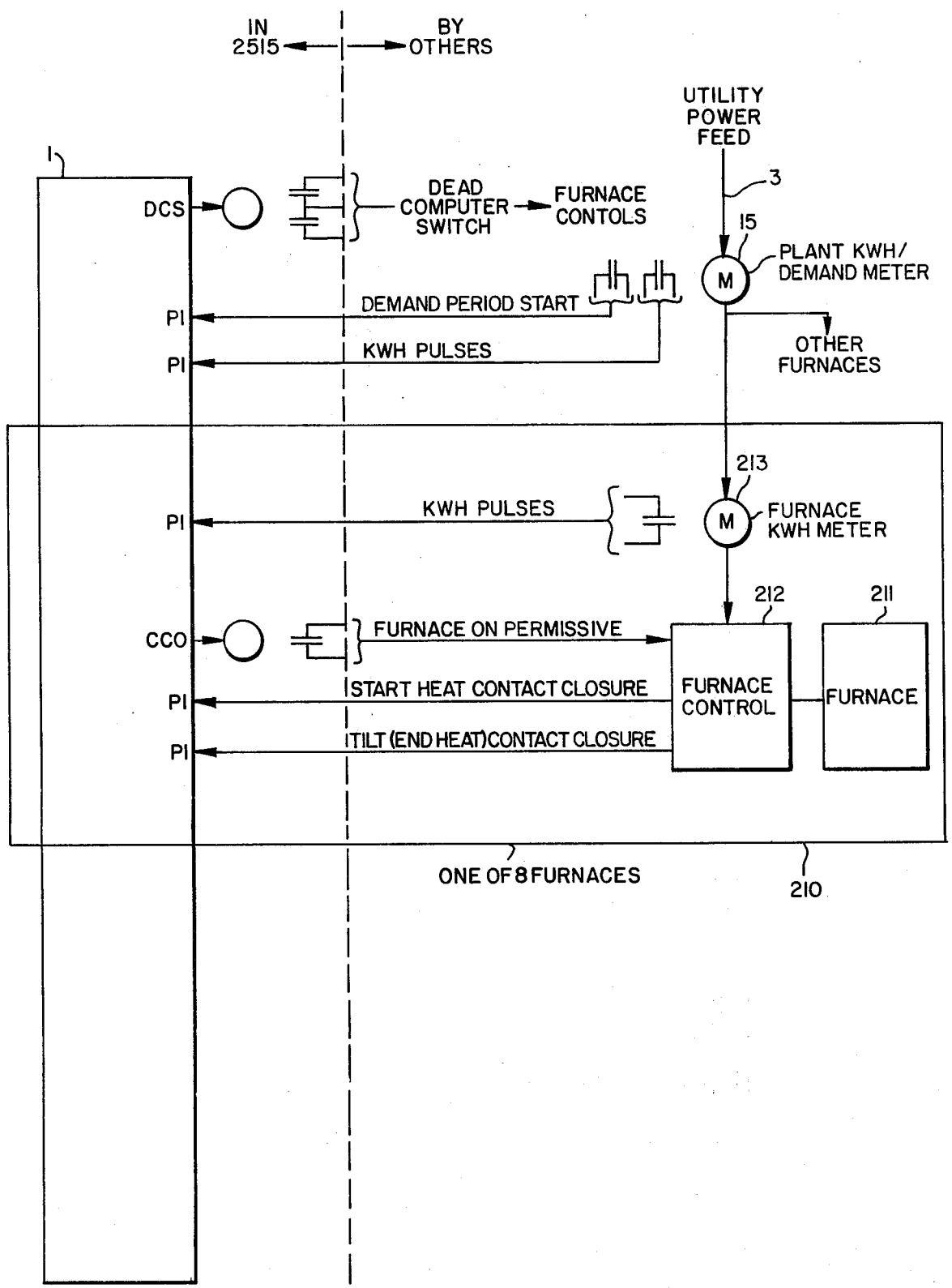
FIG. 9 illustrates in a way similar to FIG. 6 the interface of the computer control system used with the units of production.

Referring now to FIG. 9, the interface is shown between the instrumentation and apparatus controlled in the plant by the computer control system 1 and those controlled outside the control system. The plant includes, typically, 8 furnaces, one of them 210 is shown with the furnace proper 211 and the furnace control 212 with an associated meter 213. The main meter is at 15 from the utility power company feeder. From each meter go to the pulse inputs PI of the control system pulses due to closing of the demand period start interrupt (of the main meter 15) and to the KW pulse interrupts of the meters (main and individual). Pulse inputs are also received from the furnace control circuit, such as the one do to start heat contact closure, and to the End Heat contact closure (TILT). In the opposite direction, namely from the computerized control system, the CCO (contact closure output) indicates to the furnace control circuit the furnace ON or OFF permissive condition. The system is also provided with a dead computer switch DCS which can be used for overriding the furnace control circuit of all furnace units in the event of a computer system failure.

On the basis of the explanations given, the operation of the control system implementing the method according to the invention may be described as follows:

The computerized control system basically controls, for each furnace, a 'Furnace on Permissive' contact. It opens and closes these contacts in such a way as to try to limit the average plant power consumption over a fixed period (the 'Demand Period'—usually 15 min.) to be close to but less than a preset value (the 'Demand Limit KW'). In deciding when to manipulate the contacts and which ones to manipulate, the computerized system refers to the various rules and conditions stored internally.

The control algorithm typically operates as follows:

The demand pulse from the plant KWH meter 15 resets the computer demand period timer (internal timing of the period is from the computer real-time clock). KWH pulses from the plant KWH meter are received by the controller as interrupts (or frequently scanned status contact inputs) which represent KWH consumed and these interrupts initiate the calculation of the total KWH in the period in relation to the elapsed time of the period. From this data an actual point on the demand curve (FIG. 4) is determined, and the actual slope of the curve is determined using a weighted average of the last three pulse periods (last four pulses). Actual slope is used to predict final demand at end of the period. Depending on the demand prediction, time into period, and values of various furnace constraints and control parameters, the computer system may open or close the furnace power on permissive contacts to force the end of period demand toward the demand limit. The time at which a load is actually added, or shed, is determined and controlled in consideration of the incremental demand impact that particular load will have on the remaining portion of the period and on the response time of the load, e.g., the time it takes for the load to change its power usage. The operation of the algorithm is shown graphically in FIGS. 11 considered hereinafter. The detailed action the computer takes is dependent on how much of the demand period has expired.

Typically three regions or fields of control are provided during the 15 minute period (refer to FIG. 4). These fields go from "very permissive" to less permissive, and the last allows for full, conservative control when close to the end of the period. The fields may be defined as follows:

Field 1—Loads will be turned ON but not OFF.

Field 2—Loads will be turned both ON and OFF but will not be turned OFF enough to reduce the projected demand under the target. The target is the demand limit modified by various biasing or deadband techniques.

Field 3—Loads are turned ON and OFF but are not turned ON if doing so would raise the projected demand above the limit. In the last part of the period, it can be arranged so that loads are not turned ON if doing so would raise the projected demand above a demand limit biased downward slightly.

The system automatically extrapolates the kilowatt hour meter pulses at the end of a demand period to apportion the energy between the period and the next period.

The system senses its own power failure and executes an orderly computer shutdown to retain the integrity of its control ability. Power restoration automatically restarts the computer, restoring the control at an initialized condition. Automatically a relay contact output opens on computer failure. Such contact is used for alarm or shutdown functions by the user. The initialized condition, when the system comes on, is variable but usually is set at all loads in 'AUTO ON' condition so that the system will not inhibit loads but will try to control loads.

The control system calculates when to shed, or add, loads based on the actual current value of the load itself which is remembered within the system. At each kilowatt hour pulse, the value in the system that load is updated as a function of the actual load being drawn. That load is determined as a weighted average of the last three pulse periods. At the start of a heat, since there is no prior history for the heat, the nameplate rating, as defined by the customer, is inserted into the table of load values. This value may also be used as the ceiling on the actual current KW value calculated by the system. Should the actual current KW value calculated drop below a minimum value (also defined by the customer), that load in such instance is considered as having been externally turned off.

Loads are shed, or restored, based on the following:

a. Furnaces are shed on a "last on-first off" basis.

b. Furnaces are restored on a "last off-first on" basis.

c. If during an interval the controller is in a demand control mode, it will inhibit any new furnace from being brought on line until all loads previously shed have been restarted. However, the controller will keep track of and automatically start the new furnace after all those previously shed have been restored, provided that the starting of the new furnace will not put the demand over the demand limit for the remainder of the internal.

Since loads can individually be on or off, externally inhibited or allowed, and under manual or automatic control, the tracking of each load's current shed and restore priority is quite complex. Three 'Priority Stacks' (Memories I, II, III) are used to track these priorities as described in FIGS. 8 and 11 hereinafter.

EXAMPLE OF SYSTEM LOGS

The control sytem (referred to at some places by the code name 2515 or W2515) can provide various types of logs. As an illustrative example, the following logs may be, and usually are, provided:

1. Demand Log

The computer system will output a demand log at the end of each demand period, whether or not it is doing demand control. The demand log will consist of:

Time (Month, Day, Hour, Minute, Second)
Demand Limit Setpoint (KW)
Actual Demand (KW)
Energy Used (KWH)
Loadfactor (Demand/Limit)
Energy Controlled (Changed by 2515) the last hour

| Sample | |
|---|---|
| DEMAND PERIOD ENDING 8/ 5 17:51:35 (W)2515 CONTROLLER ON AU | |
| LIMIT | = 30000. KW |
| ACTUAL | = 25313. KW |
| LOADFACTOR | = 84.4% |
| ENERGY USED | = 6328.KWH |
| (W) CONTROLLED | = 2355.KWH |

With respect to the demand log, the following is to be observed:

a. The demand limit used in the limit and load-factor printouts is that in effect at the end of the demand period.

b. Energy controlled is positive for net load shedding and negative for net load restoring and is intended to be a general indicator of system activity rather than a very accuarate audit.

c. This particular log is not called up by the operator. It overrides all other logs.

2. Event Log

If enabled by the operator (log type 1), this log indicates the time into the demand period that each load is turned on or off.

| Sample | |
|---|---|
| ENTER CODE LETTER L | |
| ENTER LOG TYPE AND MINS. 1,480 | |
| LOG TYPE 1 WAS O | |
| ENTER CODE LETTER E | |
| OFF 301 S | 2 |
| OFF 605 S | 1 |
| ON 775 S | 1 |
| OFF 876 S | 1 |

With this particular log, the following remarks are in order:

a. In this log, the time is the time the printout was requested internally in the system. This may be several seconds after the event and several seconds before the printout, depending on system activity.

b. In this and other logs, loads are identified by load or unit numbers internal to the computer organization (not by customer load or furnace number).

3. Heat Log

The computer receives contact closures from each furnace indicating the start and end of a heat. Regardless of whether or not the furnace is on demand control, the end of a furnace heat will trigger a heat log. The heat log printout will be indented one half of the page and will consist of the following:

Load Number
Heat Start Tme (Month, Day, Hour, Minute, Second)
Total Heat Time (Min, Sec)
Power off time within the heat period (Min, Sec)
Shed Time, if furnace was shed by controller (Min, Sec)
KWH Used
Percent of heat the power was on
Time between last heat end and this heat start.

| Sample |
|---|
| FURNACE 3 HEAT STARTED 8/ 5 15: 6:31 |
| TOTAL HEAT TIME = 107 M 23 S, OF WHICH |
| POWER OFF TIME = 10 M 4 S, OF WHICH |
| 2515 SHED TIME = 7 M 6 S. USED 32840. KWH |
| PWR ON 100.0% OF HEAT TIME |
| HEAT STARTED 22 M 27 S AFTER LAST HEAT |

The following remarks obtain:

a. The operator cannot call up this log.

b. Times are limited to 9 hours. Times over 9 hours indicate invalid timing data.

c. Furnace numbers are computer referenced load numbers.

4. Furnace Status Log

The operator can call for a furnace status log via the teletypewriter at any time. This log includes the following information:

Plant KW
Date (Month, Day)
Time (Hour, Minute, Second)
Furnace Number (Load Number)
Mode (Automatic/Manual)
Furnace: On/Off
Furnace in Heat State: Yes/No Duration of Heat (or not in heat) State: Hour, Minutes, Seconds
Furnace KW

| Sample | | | | | |
|---|---|---|---|---|---|
| ENTER CODE LETTER Q | | | | | |
| Plant KW = 31104. 8/ 5 17:54:41 | | | | | |
| FURN | AU/MA | ON/OFF | INHEAT | DUR-ATION | CURR KW |
| 1 | AU | OF | Y | 0:1:28 | O |
| 2 | AU | ON | Y | 2:43:2 | 8400 |
| 3 | AU | ON | Y | 0:1:48 | 12500 |

5. Priority Status Log

The power demand control system sheds (or restores) a furnace (or furnaces) based on a "last on - first off" (or last off - first on) priority. An operator can call for a printout on the teletypewriter of the priority status of furnaces which are going to be shed (or restored) at any given time. The log printout will include the following information:
Date: (Month, Day)
Time (Hour, Minutes, Seconds)
Furnaces On Priority List
Furnaces Off (for any reason) List
Furnaces Off (due to demand control) Priority List

| Sample (Including Effect of 'Protecting' a load) | | |
|---|---|---|
| ENTER CODE LETTER G | | |
| PRIORITY STATUS 8/ 5 17:55:14 | | |
| ON | OFF | DCOFF |
| 3 | 1 | 1 |
| 2 | 0 | 0 |
| 0 | 0 | 0 |
| 17:81:44 PROTECTED LOAD #3 | | |
| ENTER CODE LETTER G | | |
| PRIORITY STATUS 8/ 5 17:55:58 | | |
| ON | OFF | DCOFF |
| 2 | 1 | 1 |
| 3 | 0 | 0 |
| 0 | 0 | 0 |

It should be observed:
a. The ON, OFF, and DCOFF lists represent load numbers that are ON (for any reason), OFF (for any reason), and OFF (due to the 2515 having shed them or not yet acted on their start heat inputs).
b. Loads are shed from the top of the ON list. The highest priority ON load is the last load in the ON list. (A load must be on demand control to be shed).
c. Loads are restored from the top of the DCOFF list. Start heat requests go on the bottom of the DCOFF list. The lowest priority load is the last load in the DCOFF list; the next load to be restored is the top load in the DCOFF list. (A load must be on demand control to be restored but non-demand control loads can be turned on and off via the teletypewriter manual On/Off commands).
d. At any given time, one load may be 'Protected-'—made the last load to be shed (if on) or the next load to be restored (if off due to demand control). This can be done via a pushbutton (one for each load) or selector switch or the 'J' teletypewriter command. In either case the fact that a furnace was protected is logged. The push button version and its effect on the ON, OFF, and DCOFF lists is shown above. The teletypewriter input to protect a load is:

ENTER CODE LETTER J
ENTER UNIT #2
16:21:12 PROTECTED LOAD #2

6. Unit Characteristics Printout

The operator can display (Code Letter K) and modify (Code Letter P) several parameters and characteristics for each load. The meaning of each of these is as follows:

| | | | |
|---|---|---|---|
| ENTER CODE LETTER K | | | |
| ENTER UNIT #2 | | | |
| UNIT# 2 | | | |
| COL# 1 VALUE | 8400- | Load Rating, KW | |
| COL# 2 VALUE | 32767- | * | |
| COL# 3 VALUE | 0- | * | |
| COL# 4 VALUE | 2- | * | |
| COL# 5 VALUE | 0- | * | |
| COL# 6 VALUE | 257- | * | |
| COL# 7 VALUE | 0- | (Off Time Accumulator, Sec) | |
| COL# 8 VALUE | 223- | (On Time Accumulator, Sec) | |
| COL# 9 VALUE | 8193 | * | |
| COL# 10 VALUE | 8193- | (Odd/Even = On/Off) | |
| COL# 11 VALUE | 0- | * | |
| COL# 12 VALUE | 0- | * | |
| COL# 13 VALUE | 8192- | * | |
| COL# 14 VALUE | 0- | (Last KW Value Read) | |
| COL# 15 VALUE | 0- | * | |
| COL# 16 VALUE | 0- | * | |
| COL# 17 VALUE | 0- | * | |
| COI# 18 VALUE | 90- | Max Seconds Between KWH Pulse for Load to be On | |
| COL# 19 VALUE | 0- | (Heat On and Power Off Seconds) | |
| COL# 20 VALUE | 0- | (Heat on and Shed Seconds) | |
| COL# 21 VALUE | 0- | (Heat Time) | |
| COL# 22 VALUE | 0- | (KWH Used) | |
| COL# 23 VALUE | 0- | (Month Heat Started) | |
| COL# 24 VALUE | 0- | (Day Heat Started) | |
| COL# 25 VALUE | 0- | (Hour Heat Started) | |
| COL# 26 VALUE | 0- | (Minute Heat Started) | |
| COL# 27 VALUE | 0- | (Second Heat Started) | |
| COL# 28 VALUE | 0- | (Last KW Value Read Before Shedding) | |
| COL# 29 VALUE | 90- | Response Time of Load, Seconds See Note d. | |
| COL# 30 VALUE | 0- | * | |
| COL# 31 VALUE | 0- | * | |
| COL# 32 VALUE | 0- | * | |
| COL# 33 VALUE | 1169- | * | |

The following remarks on the above code list are in order:
a. *=Internal values not for user use
b. ( )=Values user may observe but not change
c. Columns 1, 18, and 29 may be modified by user via the 'P' code letter.
d. After initiating a change in load (On to Off or vice versa) big enough to have the desired effect, the system will wait for the time in column 29 of the last load changed before initiating further changes.

OPTIONAL LOGS

01. 24-Hour-Day Summary

Upon command from the Operator enabling log type 5 or at a preselected time of day the computer system will print a day summary log to include the following for each load and for the overall plant:

Date and Time
High KW Reading and When Read
High Demand KW Reading and When Read
Total KWH
Number of Heats
Total Power On Time (Hr:Min)
Total Power Off Time (Hr:Min)
Total Shed Time (Hr:Min)
Total Not In Heat Time (Hr:Min)
% Time Power Was On
Total Plant Load Factor

| Sample |
| --- |
| ENTER CODE LETTER L |
| ENTER LOG TYPE AND MINS. 5,0 |
| LOG Type 5 WAS O |
| W2515 DAY SUMMARY 8/ 5/1977 17:41 |

|  | PLANT | FURN 1 | FURN 2 | FURN 3 |
| --- | --- | --- | --- | --- |
| HI KW | 28276. | 5625. | 0. | 12536. |
| TIME | 17:34 | 17:35 | 0:0 | 17:39 |
| HI DEM | 29797. | 4417. | 3050. | 12570. |
| TIME | 17:36 | 17:36 | 17:36 | 17:36 |
| TOT KWH | 7430. | 1080. | 600. | 3080. |
| NO HEATS | 0 | 0 | 0 | 0 |
| PWR ON TIME | 0:15 | 0:7 | 0:0 | 0:9 |
| PWR OFF TIME | 0:10 | 0:2 | 0:9 | 0:0 |
| SHED TIME | 0:10 | 0:2 | 0:9 | 0:0 |
| % TIME PWR ON | 59.3 | 79.2 | 0.0 | 100.0 |
| TOTAL PLANT LOADFACTOR 99.32% | | | | |

The preceding type of log calls for the following remarks:

a. For the plant, total power on time, total shed time, and total not in heat time are the sum of the values for all loads.

b. For the plant, total plant load factor is the sum of the logged plant demands at the end of the demand periods divided by the sum of the logged demand limits at the end of the demand periods.

c. For the plant, % time power was on is the sum of all the furnace power on times divided by the sum of all furnace power on and power off times.

d. If requested from the teletype the system does not reset the log accumulators to zero; if requested by the preselected day time, the log accumulators are reset to zero.

02. 24-Hour Shift Summary

Upon command from the operator enabling log type 3 or at a preselected time of day the system will print a summary of the last 24 hours by shifts, including:
Date and Time
High KW Demand Reading and When Read
Total KWH (Plant)
Total KWH by Load

| Sample SHIFT SUMMARY 5/20/1977 0:29 | | | |
| --- | --- | --- | --- |
|  | 0800–1600 | 1600–2400 | 000–8000 |
| HI KW DEM | 185455. | 185842. | 185390. |
| HI KW TIME | 12:28 | 17:28 | 7:58 |
| HI KVAR DEM | 0. | 0. | 0. |
| HI KVAR TIME | 15:15 | 23:58 | 0:28 |
| TOTAL KWH | 295547. | 480617. | 665020. |
| FURN 1 KWH | 71540. | 82340. | 92240. |
| FURN 2 KWH | 71540. | 81540. | 91980. |
| FURN 3 KWH | 64560. | 74400. | 83580. |
| FURN 4 KWH | 207120. | 234960. | 265980. |
| FURN 5 KWH | 177240. | 203940. | 277400. |
| FURN 6 KWH | 0 | 0 | 0 |
| FURN 7 KWH | 0. | 0. | 0. |
| FURN 8 KWH | 0. | 0. | 0. |

03. Demand log with load KWH

| Sample (Also Showing Limit Exceeded Warning) |
| --- |
| DEMAND PERIOD ENDING 5/20 1:28:14 (W)2515 |
| CONTROLLED ON AU  LIMIT = 185000.KW |
| ACTUAL = 185423.  LOADFACTOR = 100.2% |
| ENERGY USED = 92712.KWH |
| (W)2515 CONTROLLED = 1051.KWH |

| FURN | KWH USED |
| --- | --- |
| 4 | 5120. |
| 6 | 5140. |
| 9 | 4680. |
| 15 | 14820. |
| 16 | 12780. |
| 12 | 0. |
| 13 | 0. |
| 14 | 0. |

DEMAND LIMIT EXCEEDED
CURRENT POWER RATE 180000. KWH/H PERIOD
LENGTH 1800 SEC

Typically, the operator communicates with the system via a teletypewriter, CRT, or similar device. The codes a system typically may use to do this are illustratively shown as follows:

| Code | |
| --- | --- |
| A | Not Used |
| B | Demand Limit Undertarget Bias |
| C | Not Used |
| D | Demand Limit Target |
| E | Exit (no more code letters to enter) |
| F | Option On/Off |
|   | 1 = Energy Conservation - Not Used |
|   | 2 = Time of Day Scheduler - Not Used |
|   | 3 = On Line Simulation- Not Used |
|   | 4 = Status Scan - Not Used |
|   | 5 = Floating Target |
|   | 6 = Constraint Override - Not Used |
| G | Priority Status Log |
| CTL-G | Print Monthly Totals and Reset |
| H | Hours, Minutes, Sec. Clock Set |
| I | Input the Data Tables (only if 2515 in manual) |
| J | Protect a Load |
| K | Display load characteristics from 'KD' Tables ('COL' Tables) |
|   | KD1 Load Nominal Value (KE) |
|   | KD2 D.C. Max Off Time |
|   | KD3 D.C. On/Off Ratio |
|   | KD4 D.C. Priority |
|   | KD5 D.C. Sub-Priority |
|   | KD6 CCO Control Word Register-Bit |
|   | Allowable registers are 1 = N |
|   | Allowable bits are 0–15 |
|   | Example . . . |
|   | DAT X'0100' 13 Register 1 Bit 0 |
|   | DAT X'020F' 16 Register 2 Bit 15 |
|   | KD7 Off Time Accumulator |
|   | KD8 On Time Accumulator |
|   | KD9 Desired Control/Desired Status |
|   | KD10 Current Status |
|   | KD11 D.C. Min. Off Time |
|   | KD12 Last Status (See Statph) |
|   | KD13 Possible Control Bits |
|   | KD14 Actual Current Load Value (Kw) |
|   | KD15 Start Heat PI is in Flag (− = PI IN) |
|   | KD16 Heat On Flag (− V Heat in Progress) |

-continued

| Code | |
|---|---|
| | KD17 End Heat PI is in Flag (— = PI IN) |
| | KD18 Max. Sec. Between KWH Pulses if Load Considered On |
| | KD19 Heat On & Pwr. Lt. No Load KW Time Accumulator (Sec) |
| | KD20 Shed Time Accum. for a Heat |
| | KD21 Heat Time Accum. for a Heat |
| | KD22 KWH Used Accum. for a Heat |
| | Heat Start Time Recorders KD23–KD27 |
| | KD23 Month |
| | KD24 Day |
| | KD25 Hour |
| | KD26 Minutes |
| | KD27 Sec. |
| | KD28 Saved Last/Actual Load KW Value 84 D.C. Shed Load |
| | KD29 Load Response Time, Sec. |
| | KD30 Load Response Time Timer, if Reqd. (Alt. to Loadtimer) |
| | KD31 Previous Value of KD22-Load KWH |
| | KD32 Time Since Last KWH Pulse Timer |
| | KD33 Time From Last End Heat to Current Siri Heat Dr. Now |
| | Control Bits for KD9, 10, 12, 13 |
| | 15 = Manual Control |
| | 14 = Time of Day Scheduler |
| | 13 = D.C. |
| | 12 = E.C. |
| | Control Bits for KD9, 10, 12 only |
| | Status Bit |
| | 0 = On (1), Off (0) |
| L | Log Request (Overrides last request; 500 minutes max) |
| | 1 = Event Log |
| | 2 = Status Log |
| | 3 = Shift Summary (Snapshot) - Not Used |
| | 4 = Plot - Not Used |
| | 5 = Day Summary (Snapshot) - Not Used |
| The 'Normal' status log ('L,2') uses the following status codes for each load: | |
| | 0 = Auto Off       5 = EC On - Not Used |
| | 1 = Auto On        6 = TOD Off - Not Used |
| | 2 = DC Off         7 = TOD On - Not Used |
| | 3 = DC On          8 = Manual Off |
| | 4 = EC Off - Not Used   9 = Manual On |
| M | Manual/Auto (0/1) Mode for Entire 2515 |
| N | Set Length of Demand Period Interval 1 |
| O | Output (Punch) the Data Tables |
| P | Change the Load Characteristics ('KD' Tables) |

-continued

| Code | | |
|---|---|---|
| Q | Furnace Status Log | |
| R | Set Length of Demand Period Interval 1 + 2 | |
| S | Not Used | |
| T | Set Clock by Register | |
| | 0 Sec | 0–59 |
| | 1 Min | 0–59 |
| | 2 Hour | 0–23 |
| | 3 Day | 1–7  1 = Sunday |
| | 4 Week | 1–52 |
| | 5 Month | 1–12 |
| | 6 Day in Month | 1–12 |
| | 7 Year | 4 digits |
| | 8 # Days in Month | 28–31 |
| U | Change Load Control Status | |
| | 0 Allow Auto State | |
| | 2 Set Auto State = Demand Control | |
| | 8 Manual Off | |
| | 9 Manual On | |
| | Other Not Used | |
| V | Not Used | |
| W | Not Used | |
| X | Not Used | |
| Y | Month, Day, Year Clock Set | |
| Z | Bid Debug (for use only by authorized persons) | |

EXAMPLE OF THE PRESENT INVENTION IN OPERATION

The following shows about 75 minutes of control operation effective with the control system according to the present invention upon six arc furnaces of an industrial plant. During this time the loads were shed and restored several times; a furnace tilted and started another heat; and a furnace was manually turned on.

All 'Q' and 'G' logs are operator requested. Demand and Event logs are output without operator requests. Underlined quantities are explanatory comments:
DL=Demand Log
EL=Event Log
FS=Furnace Status Log ('Q')
PS=Priority Status Log ('G')

Demand logs may 'Break Into' other logs. Event logs may 'Break Into' heat logs (and normally do if active) but not into furnace or priority status logs.

```
ENTER PASSWORD SU
ENTER CODE LETTER H
ENTER HOUR, MIN., SEC.10,6,0
TIME IS 10: 6: 0
ENTER CODE LETTER Y
ENTER MON., DAY, YEAR 10,22,1976
DATE IS 10/22/1976                              SETTING
ENTER CODE LETTER T                             THE
ENTER TIME REGISTER INDEX AND                   CLOCK
   CONTENTS 3,6
TIME REGISTER #3 CONTENTS NOW 6 WERE 3
ENTER CODE LETTER T
ENTER TIME REGISTER INDEX AND
   CONTENTS 8,31
TIME REGISTER #8 CONTENTS NOW 31 WERE 31
ENTER CODE LETTER T
ENTER TIME REGISTER INDEX AND
   CONTENTS 4,42
TIME REGISTER #4 CONTENTS NOW 42 WERE 42
ENTER CODE LETTER L
ENTER LOG TYPE AND MINS. 1,480   }  REQUESTING EVENT LOG
LOG TYPE 1 WAS 1
ENTER CODE LETTER E - EXIT
DEMAND PERIOD ENDING 10/22 10:10:21 (W) W2515 CONTROLLER ON AU
     LIMIT=24000.KW   ACTUAL=23945.KW   LOADFACTOR=99.8%   DL
  ENERGY USED=5986.KWH   (W) 2515 CONTROLLED= −481.KWH
          OFF      631  S  1
          ON       744  S  1                                    EL
DEMAND PERIOD ENDING  10/22  10:25:21 (W)2515 CONTROLLER ON AU
```

-continued

```
    LIMIT=24000.KW   ACTUAL=23971.KW   LOADFACTOR=99.9%    DL
    ENERGY USED=5993.KWH   (W)2515 CONTROLLED= 129.KWH
         OFF      635  S   1
         ON       737  S   1                                            EL
         OFF      775  S   1
         ON       797  S   1
DEMAND PERIOD ENDING 10/22 10:40:21 (W)2515 CONTROLLER ON AU
    LIMIT=24000.KW   ACTUAL=23905.KW   LOADFACTOR=99.6%    DL
    ENERGY USED=5976.KWH   (W)2515 CONTROLLED=141.KWH
ENTER PASSWORD SU
ENTER CODE LETTER Q
FURNACE STATUS LOG   10/22   10:41: 5
                                                      CHECKING
        FURN  AU/MA   ON/OFF   INHEAT   HEATSEC       FURNACE
                                                      STATUS
         1     AU      ON        Y       2320         ('FS')
         2     AU      ON        Y       3847
  (I)    3     AU      ON        Y       3851
         4     MA      OF        N          0
         5     MA      OF        N          0
         6     MA      ON        N          0
ENTER CODE LETTER G
PRIORITY STATUS   10/22   10:41:48
         ON    OFF    DCOFF
                                         CHECKING
                                         PRIORITY
         1     5       0                 STATUS
         2     4       0                 ('PS')
  (A)    3     0       0
         0     0       0
         0     0       0
         0     0       0
ENTER CODE LETTER E - EXIT
OFF   632  S  1 ----2515 TURNED FURN 1 OFF         EL
ENTER PASSWORD SU
ENTER CODE LETTER G
PRIORITY STATUS   10/22   10:51:5
         ON    OFF    DCOFF
         2     1       1       ←COMPARE WITH A
         3     5       0
  (B)    6     4       0                                                PS
         0     0       0
         0     0       0
         0     0       0
ENTER CODE LETTER Q
FURNACE STATUS LOG   10/22   10:51:32
        FURN  AU/MA   ON/OFF   INHEAT   HEATSEC
         1     AU      OF        Y       2946     ←COMPARE WITH I
         2     AU      ON        Y       4474
  (II)   3     AU      ON        Y       4478                           FS
         4     MA      OF        N          9
         5     MA      OF        N          0
ENTER CODE LETTER E - EXIT
ON    745  S  1 ----2515 TURNED 1 BACK ON                               EL
ENTER PASSWORD SU
ENTER CODE LETTER G
PRIORITY STATUS   10/22   10:52:58
         ON    OFF    DCOFF
         1     5       0       ←COMPARE WITH B
         2     4       0
  (C)    3     0       0                                                PS
         6     0       0
         0     0       0
ENTER CODE LETTER Q
FURNACE STATUS LOG   10/22   10:53:25
        FURN  AU/MA   ON/OFF   INHEAT   HEATSEC
         1     AU      ON        Y       3059     ←COMPARE WITH II
         2     AU      ON        Y       4587
  (III)  3     AU      ON        Y       4591                           FS
         4     MA      OF        N          0
         5     MA      OF        N          0
         6     MA      ON        N          0
ENTER CODE LETTER E - EXIT
DEMAND PERIOD ENDING 10/22 10:55:21 (W)2515 CONTROLLER ON AU
    LIMIT=24000.KW   ACTUAL=23971.KW   LOADFACTOR=99.9%    DL
    ENERGY USED=5993.KWH   (W)2515 CONTROLLED=129.KWH
            FURNACE 2 HEAT STARTED    10/17   0:52:8
                                                   HEAT LOG
        TOTAL HEAT TIME=4728  S, OF WHICH          FURNACE 2
        OFF     43   S   2                        TILTED
        POWER OFF TIME=162  S, OF WHICH
        2515 SHED TIME=162  S. USED 800.KWH
ENTER PASSWORD SU
```

-continued

```
ENTER CODE LETTER G
PRIORITY STATUS   10/22  10:57: 7
      ON    OFF   DCOFF
      1     2     0       ←COMPARE WITH C
      3     5     0
(D)   6     4     0                                              PS
      0     0     0
      0     0     0
      0     0     0
ENTER CODE LETTER Q
FURNACE STATUS LOG   10/22  10:57:33
      FURN  AU/MA  ON/OFF  INHEAT  HEATSEC
      1     AU     ON      Y       3308
      2     AU     OF      N       0       ←COMPARE WITH III
      3     AU     ON      Y       4839
(IV)  4     MA     OF      N       0                            FS
      5     MA     OF      N       0
      6     MA     ON      N       0
ENTER CODE LETTER E - EXIT
ENTER PASSWORD SU      (FURNACE 2 STARTED ANOTHER HEAT)
ENTER CODE LETTER Q
FURNACE STATUS LOG   10/22  11:0:29
      FURN  AU/MA  ON/OFF  INHEAT  HEATSEC
      1     AU     ON      Y       3484
      2     AU     ON      Y       22      ←COMPARE WITH IV
      3     AU     ON      Y       5015
(V)   4     MA     OF      N       0                            FS
      5     MA     OF      N       0
      6     MA     ON      N       0
ENTER CODE LETTER G
PRIORITY STATUS   10/22  11:1:10
      ON    OFF   DCOFF
      2     5     0       ←COMPARE WITH D
      1     4     0
      3     0     0                                              PS
(E)   6     0     0
      0     0     0
      0     0     0
ENTER CODE LETTER E - EXIT
ENTER PASSWORD SU
ENTER CODE LETTER U                  ⎫  FURNACE 4 MANUALLY
ENTER UNIT #, CONTROL CODE 4,9       ⎭  TURNED ON
UNIT 4 NOW MANUAL/ON
ENTER CODE LETTER Q
FURNACE STATUS LOG   10/22  11:2:33
      FURN  AU/MA  ON/OFF  INHEAT  HEATSEC
      1     AU     ON      Y       3608
      2     AU     ON      Y       145
(VI)  3     AU     ON      Y       5139                         FS
      4     MA     ON      N       0       ←COMPARE WITH V
      5     MA     OF      N       0
      6     MA     ON      N       0
ENTER CODE LETTER G
PRIORITY STATUS   10/22  11:3:14
      ON    OFF   DCOFF
      4     2     2       ←COMPARE WITH E NOTE
      1     5     0       DURING LOGS VI, F
(F)   3     0     0       THAT 2515 TURNED OFF 2                PS
      6     0     0
      0     0     0
      0     0     0
ENTER CODE LETTER E - EXIT
      ON    429   S   4  ⎫  'LATE' LOGS DUE TO TTY
      OFF   502   S   2  ⎭  BEING USED                          EL
ENTER PASSWORD SU
ENTER CODE LETTER Q
FURNACE STATUS LOG   10/22  11:4:5
      FUR   AU/MA  ON/OFF  INHEAT  HEATSEC
      1     AU     ON      Y       3699
      2     AU     OF      Y       237     ←CONFIRMING 2
      3     AU     ON      Y       5231    IS OFF               FS
(VII) 4     MA     ON      N       0
      5     MA     OF      N       0
      6     MA     ON      N       0
ENTER CODE LETTER E - EXIT
      OFF   633   S   1
      ON    656   S   1                                         EL
DEMAND PERIOD ENDING   10/22  11:10:21  (W)2515 CONTROLLER ON AU
   LIMIT=24000.KW   ACTUAL=23932.KW   LOADFACTOR=99.7%   DL
   ENERGY USED=5983.KWH   (W)2515 CONTROLLED= -303.KWH
                                        (- = NET ON)
```

```
    OFF    632  S  1
    ON     734  S  1                                EL
    OFF    762  S  1
    ON     785  S  1
DEMAND PERIOD ENDING  10/22  11:25:21 (W)2515 CONTROLLER ON AU
    LIMIT-24000.KW  ACTUAL=23889.KW  LOADFACTOR=99.5%  DL
    ENERGY USED=5972.KWH  (W)2515 CONTROLLED=142.KWH
                                                      (+ = NET OFF)
```

FLOW DIAGRAMS DETAILING OPERATION OF THE PRESENT INVENTION

Figure 10A:
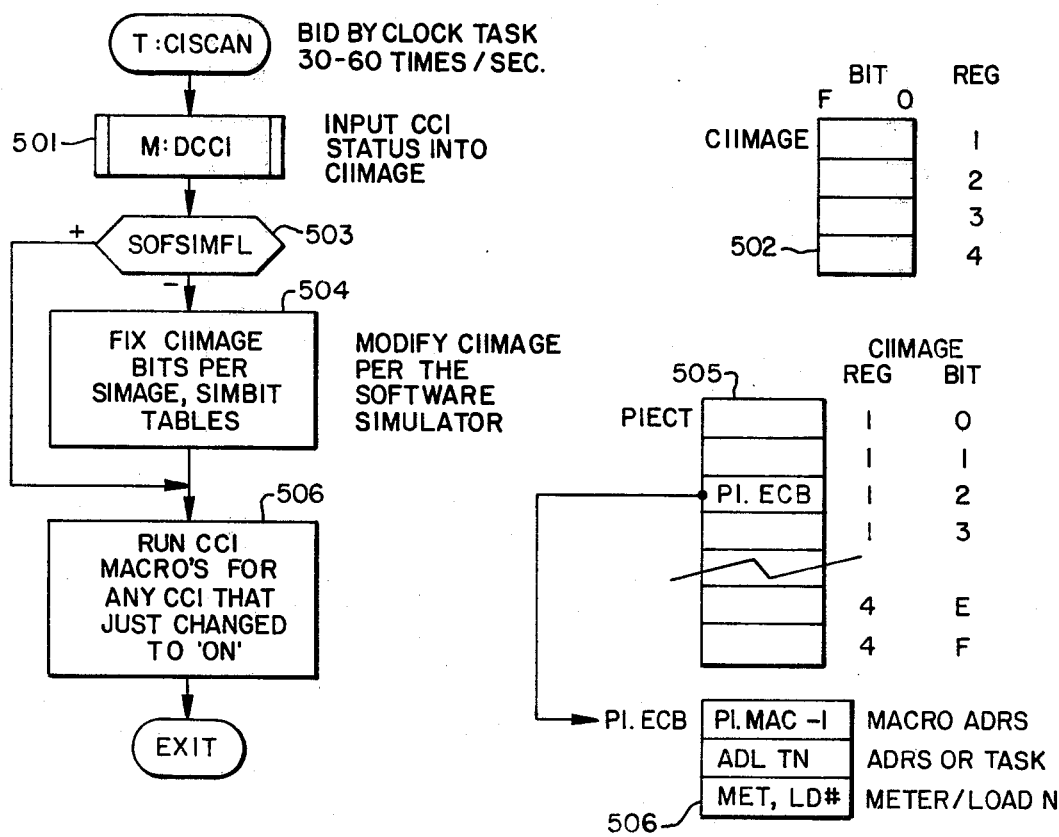
FIG. 10A is a flow chart showing tasks for handling CCI inputs in digital form.
Figure 10B:
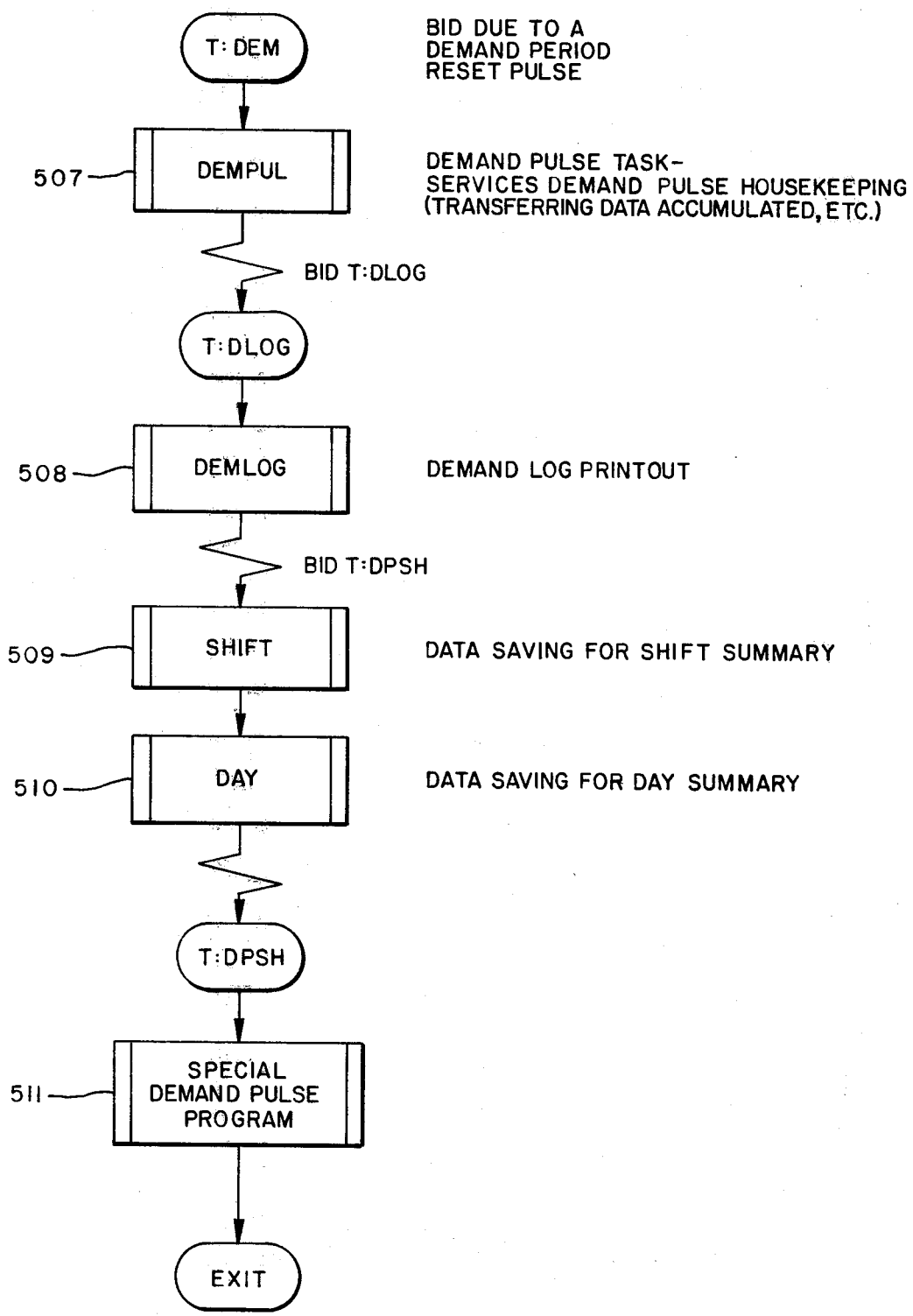
FIG. 10B shows how are initiated and performed control actions involving the receipt of a demand period timing pulse.
Figure 11A:
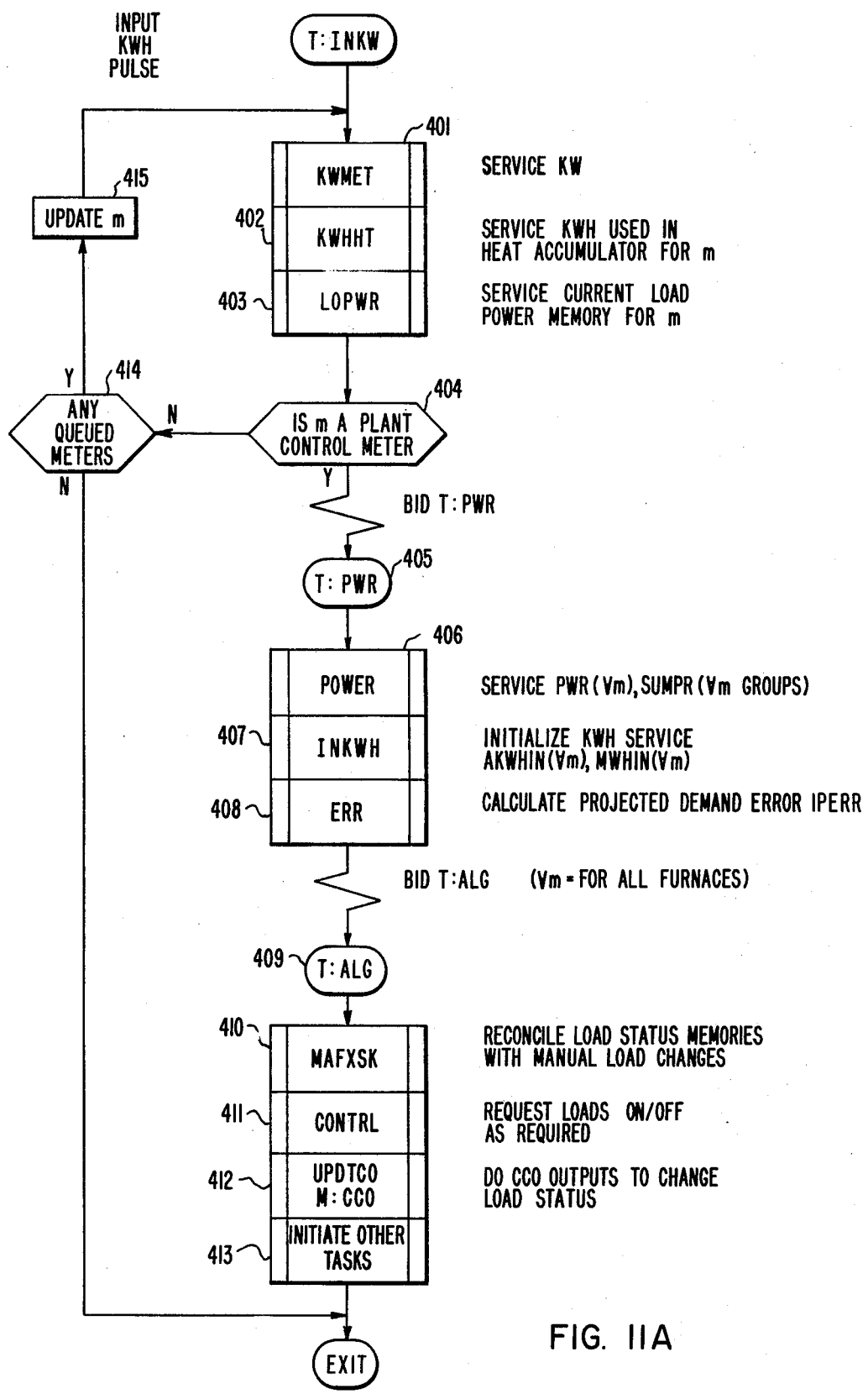
FIGS. 11A, 11B, 11C, 11D, 11E, 11F, 11G and 11H are flow charts describing the operational steps in the control method according to the invention when performed under monitoring and control of a digital computer system.
Figure 11B:
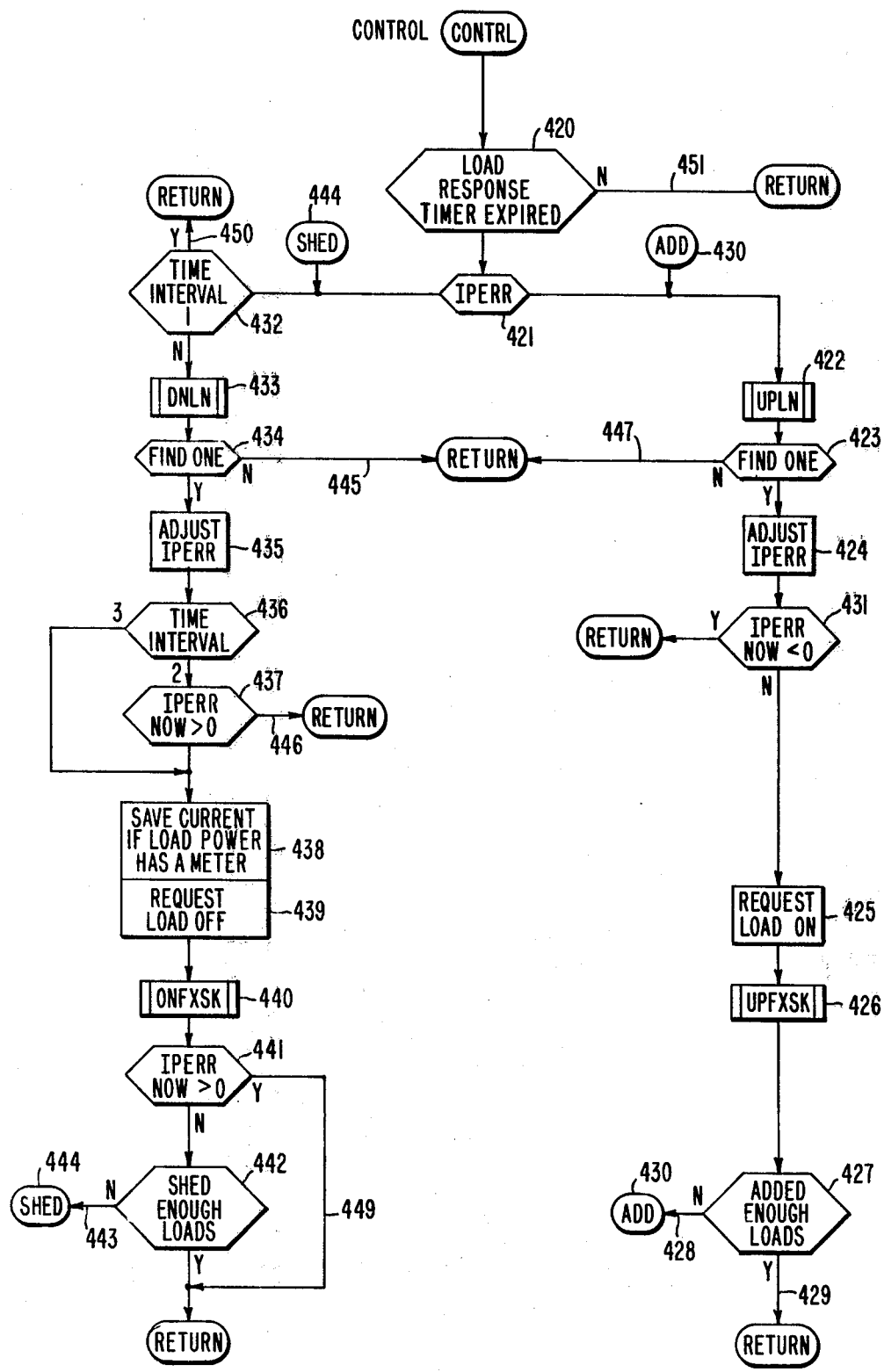
Figure 11C:
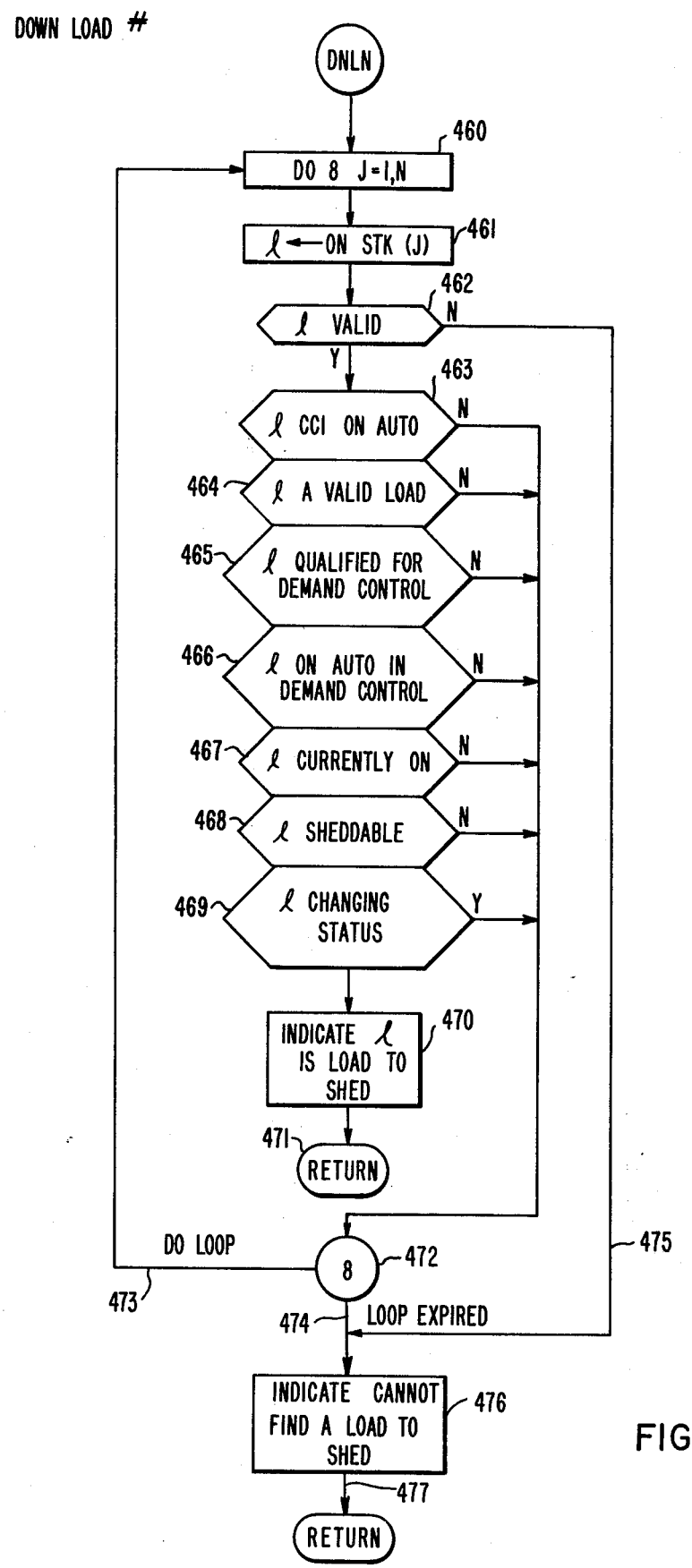

The principal operational sequences are triggered by detection of a computer system clock pulse, a demand period reset pulse, a KWH meter pulse, and various load information pulses such as start heat and end heat. These sequences are detailed in the flow charts of FIGS. 10 and 11 which represent:

FIG. 10A—The CCI Input SCAN Task
FIG. 10B—The Response to a Demand Pulse
FIG. 11A—The Overall Response to Meter KWH pulses
FIG. 11B—The Control Algorithm used when called at 411 of FIG. 11A.
FIG. 11C—The Load Shed Selection on an LOFO basis
FIG. 11D—The Load Restore Selection on an LOFO basis
FIG. 11E—The routines called by a Start Heat pulse
FIG. 11F—The routines called by an End Heat pulse
FIG. 11G—The routine used to provide a "protected" status to a load
FIG. 11H—The routines used to do the Furnace Timers Servicing FIGS. 11B to 11H are flowcharts describing in detail the process of handling loads, specifically furnaces, on a Last On, First OFF (LOFO) basis. Such method is applicable more generally with only differences in detail to general plant energy management instead of arc furnace energy management.

FIG. 10A shows in a flow chart from how the external interrupts (EI), or contact closure inputs (CCI), to the computer system at the interface thereof are scanned in order to derive in digital form a representation of the closure input status and how the data are treated in order to provide the resultant task bidding. 30 or 60 times per second there is a bid by the clock for the task of scanning the CCI as schematized in FIG. 10A. At 501 the status of the inputs of the CCI are ascertained and a digital representation is stored in four registers 1-4 (at 502) which together give an image of the overall CCI system. This table (CIIMAGE) represents the current state of the contact closure inputs or interrupts being input to the controller. At times it may be desired to modify the same indicated by CIIMAGE in response to a 'software simulator' agent that provides a realistic simulation of the plant the controller is operating upon. At 503 the system determines whether such modification needs to be done. If yes, this is done at 504. The system then proceeds at 506, to run small programs ('CCI MACROS') for any CIIMAGE bits that just went from OFF to ON. To do this, the bits from register 502 are set in vertical order per register and used to access register 505. The purpose is to facilitate calls for macro instructions at 506 for any CCI that just changed to ON. The field of illustration at the particular location in 505 (PI. ECB), includes the address (PI. MAC-1) of the particular macro instruction, the particular task to be done (ADL TN) and the associated meter or load number (MET, LD#) related to the CCI state, as spelled out within the register shown at 506. One such CCI going from OFF to ON indicates the receipt of a demand pulse. It energizes a MACRO which in turn initiates the sequence shown on FIG. 10B. It is described by the flow chart as actions occurring on the receipt of a demand pulse. This task is bid each time upon completion of a demand period by the reset pulse then issued. First at 507 certain actions are performed relative to 'demand pulse housekeeping' such as the recording or registers that record data from one demand pulse to the next and the initializing of these registers. Then, a task is bid for a demand log (T:D LOG) which entails at 508 a demand log printout (DEM-LOG). Another task relates to shift summary, that is a summary LOG that tabulates pertinent statistics by 8 hour shifts. Such task directs data saving for the shift summary (SHIFT at 509) as well as data saving for the day summary (DAY at 510). Still another task (DPSH) calls for optional special demand pulse programs at 511.

Referring now to FIG. 11A, the response of the computer system is there shown upon the receipt of a KWH meter pulse. As a result of such KWH meter pulse, the system provides at 401 indication as to which meter is selected and updates for that meter various memories indicative of the energy measured by the meter. The most important of such tables is the KW table, used to hold the 'DELTEE's' of 160, 161 in FIG. 3A. At 402, the amount of KWH used in the present heat for the load (if any) associated with the present meter (KWHHT) for that particular load is updated. At 403, the current load power is set into a memory for the particular load. The next step 404 connects with a loop for iteration through each meter that just pulsed, load 401-404. If a plant control meter bid (Yes at 404), as opposed to a load (furnace) meter, the task of computing the power (for all meters), of summing the consumed power (SUMPR) for the groups of load units, is performed at 406. At 407, if necessary, the meter energy is apportioned between the last demand period (if it just ended) and the present one. At 408, the demand error projected (like at 79 and 80 in FIG. 3B) is estimated (IPERR).

As a result of such calculated errors, the control algorithm is put to task, at 409 in FIG. 11A.

In accordance with such control decisions, at 410 the load status in the memories are reconciled with manual load changes (MAF XSK), at 411 (detailed in FIG. 11B) request is made to switch the loads ON or OFF as required (CONTRL), at 412 the CCO outputs are actuated to change load states (UPDTCO, M:CCO) while at 413 the other tasks are initiated if appropriate.

FIG. 11B shows in flow chart form the control algorithm of 411 in FIG. 11A. The left side relates to load shedding, e.g., when there is an excessive demand (IPERR on line 201 of FIG. 5 and 421 of FIG. 11B is negative. The right side shows the steps for adding load to raise the demand, e.g. when IPERR is positive (at 201 in FIG. 5 or at 421 in FIG. 11B. Initially, before the demand error IPERR is ascertained, the load response time must have expired like at 207 in FIG. 7 (Yes at 420). If it is so, at 421 IPERR is calculated like at 80 in FIG. 3B.

Assuming the error is negative (left side of IPERR) but the system operates in the first field of control (see FIG. 4), Yes at 432 leads by 450 to a return, since no shedding is effected in the first field of control. All returns on FIG. 11B imply a return to FIG. 11A to 412. When in the second field (No at 432), the system seeks at 433 a load to be shed (DNLN in 203 of FIG. 7). If none is found there is return by 445. If one is found and control operates in the second field, the system by 436 goes to 437. If the load selected would bring IPERR to be positive (Y), the system returns by 446, because during the second field of control the system should not shed excessively. If the load selected would leave IPERR negative, then load switching is acceptable through 430 and the following steps. If while at 436, the system operates in the third field of control, step 437 is skipped by 448 and again the load switching process will occur following steps 438 and the following.

Steps are taken at 438 to save current power if the load has a meter, and at 439 to request the selected load to be OFF. When this is done the step is 440 (DNFXSK within 240 in FIG. 7) where load status memory updating takes place. As a result, a proper new priority order is established between the loads to be used for subsequent load selections by the system. The rearrangement takes place according to the scheme of FIG. 8 relative to memories I, II and III. In particular, a load is purged from ONSTK and pushed onto the top of OFSTK and DCOFSTK.

If, following step 440, IPERR is still negative (No), at 442 the circuit goes to 432 until enough loads have been shed. If IPERR has become positive (Yes after 441) or at 442 enough loads have been shed, the system returns before step 420. The revised IPERR values are the 'residual error' values of Putman.

Considering now the right side of FIG. 11B, namely if IPERR is positive, the system at UPLN (422) like in 203 of FIG. 7 seeks loads to be added. If a load is found at 423, the value of IPERR is adjusted (424). When IPERR becomes negative, the system by 431 (Yes) returns to start in order to avoid adding loads since this would raise the demand over the assigned limit. If, however, IPERR remains positive (No at 431), then at 425 there is a request to switch the particular load ON. After this is done, the next step in FIG. 11B is UPFXSK at 426, consisting, like in 204 of FIG. 7, in rearranging the priority order between memories I, II, III as shown in FIG. 8. A load is purged from OFSTK and DCOFSK and pushed onto the top of ONSTK. The next step is 427 which establishes whether enough loads have been added. If Yes at 429, the system returns at the start. If No, by 428 and 430 more loads are sought again by UPLN (422) by the same processes.

Figure 11D:
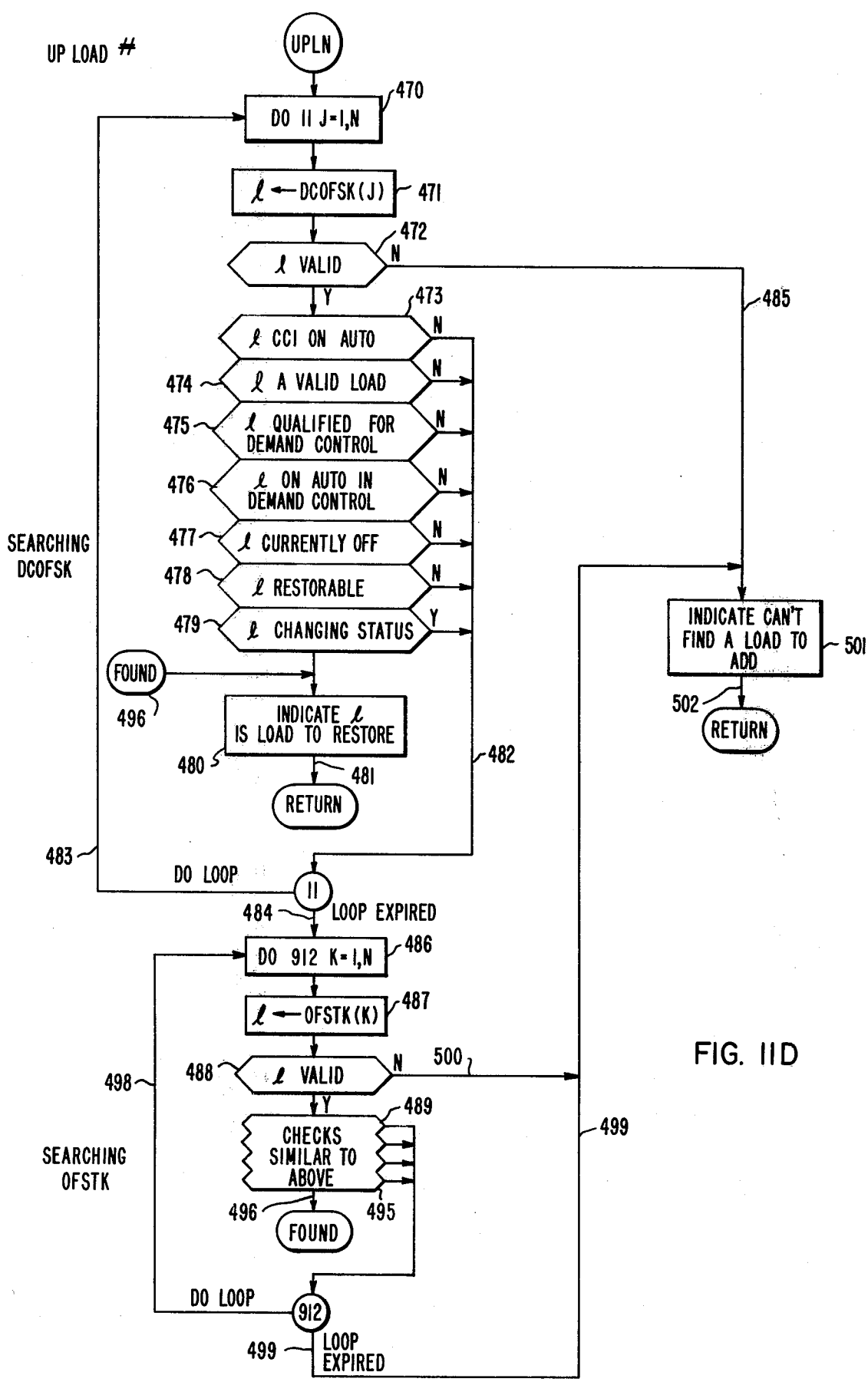

FIGS. 11C and 11D represent by a flow chart the load seeking process of steps DNLN (433) and UPLN (422), respectively. These are subroutines of the control algorithm of FIG. 11B. Referring to FIG. 11C, the object is to find the next load to shed. The loads are shed from the top of ONSTK (memory I of FIG. 8), as an iterative loop at 460 (DO 8 (J=1, N) where N is the number of loads). The selection goes through memory I as ONSTK(J) at 461. If the topmost selected load 1 is a valid selection at 462 the next steps are: at 463 is the CCI on AUTO; at 464 is it a valid load; at 465 is the load qualified for demand control; at 466 is the load on AUTO in demand control; at step 467 is the load 1 currently ON; at 468 is the load 1 sheddable; at 469 is the load 1 changing its status. If the answer is Yes to all the questions but the last and No to the last one, load 1 is rightly the load to shed and this conclusion is drawn at step 470. The system then returns at 435 to FIG. 11B. If the answer is No to any of the questions 463–468 or Yes to question 469, the system by 472 iterates, picking the next load down the memory I via the DO loop 473, 460. When the loop has expired, or directly if at 462 the load 1 is found not to be valid, the system concludes at 476 that it is unable to find a load to be shed, and the load returns the control algorithm of FIG. 11B (answer No to 434). In this way, the control algorithm of FIG. 11B effectuates shedding of loads on a "last ON-first OFF" basis (LOFO).

FIG. 11D indicates in a similar way how loads are restored on a "last OFF-first ON" basis (LOFO). At 470 the N loads are selected in a DO 11 (J=1, N) DO loop. The loads are added from the top of DCOFSTK (memory III in FIG. 8) from OFSTK (memory II in FIG. 8), as detailed in the subroutine as follows:

The load is picked up from the top of DCOFSTK at 471 and the following questions apply: at 472 is the load selection valid; at 473 is the CCI on AUTO; at 474 is the load valid; at 475 is the particular load qualified for demand control; at 476 is 1 on AUTO in demand control; at 477 is the load currently OFF; at 478 is the load restorable; at 479 is 1 changing its status. If the answer is Yes for all questions but the last and No for 479, then the load has been found and at 480 the system indicates that selected load 1 is to be restored, after which the subroutine returns back to the control algorithm of FIG. 11B. If, however, upon question 472 the answer is No, questions 473 to 479 are skipped and by 485 the subroutine indicates at 501 that no load to add can be found, and the system by 502 goes back to the control algorithm of FIG. 11B (answer No to 423). If the answer is Yes at 472, but No for any of 473 to 479, then by 482 and 483 the 470 DO 11 is effected. When the loop has expired at 484, the DO - 12 (K=1, N) is exercised at 486 in order to search OFSTK (memory II in FIG. 8). By a similar process as 471–479, here 486 to 495, a load 1 may be found at 496, or again none is found and by 500 the system returns to 501 and 502. Also when No is the answer to any of 489 to 495 the DO loop 12 by 498 seeks another load through OFSTK. When the loop has expired without reacting 496, the system again, by 499, goes to 501 and 502 (the answer is again No to 423 in FIG. 11B).

Figure 11E:
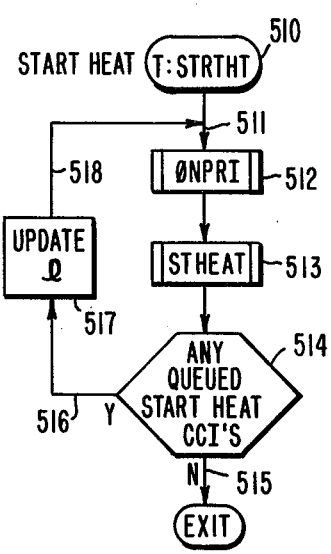

Referring to FIG. 11E the subroutine to start heat (STRTHT) is shown from 510, with a task bid initiated by any start heat CCI. The CCI is ignored for a load already in heat. At 512 (ONPRI), the system tests whether the particular load 1 is already in DCOFSK (memory III. If it is, the CCI is ignored. If it is not, the load is put on the topmost unused register in DCOFSK, while purging recording of such load from ONSTK (memory I). The next step is at 513, to initialize data on heat accumulators. At 514 the question is whether there are any other CCI's for start heat waiting to be taken up. If so, the loop 516, 517, 518 goes back to step 512 with an intermediary state for updating in the scanning process. If there is no such CCI's left, at 515 the task exits back to the system executive.

Figure 11F:
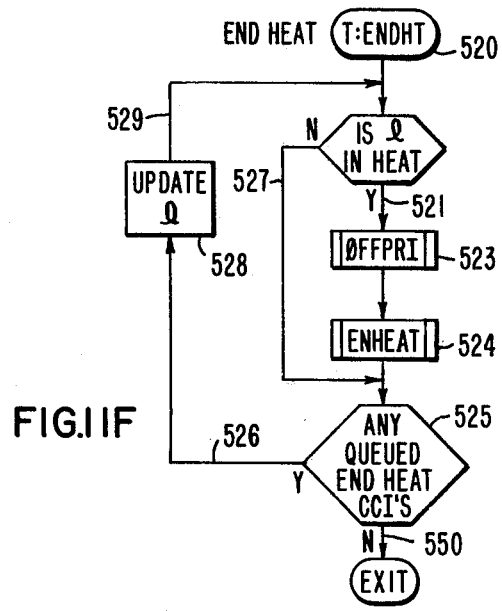

FIG. 11F is similar to FIG. 11E, but relates instead to ENDHEAT. The subroutine here is bid by any End Heat CCI. At 522 the question is for a particular load whether the load is in Heat. If No, the CCI is ignored and the subroutine seeks at 525 via 526 and 529 for another load to be tested. If Yes at 522, the action is OFFPRI at 523 to purge the particular load 1 from ONSTK, from OFSTK and from DCOFSK (all memories I, II, III) and to push 1 onto the top of OFSTK. Following this there is at 524 a printout heat log indicating that load is not in heat and giving the data pertinent to the last heat. The next selection through step 525 and loop 528, 529 ends when there are no more End Heat CCI's waiting. Then the subroutine exits.

Figure 11G:
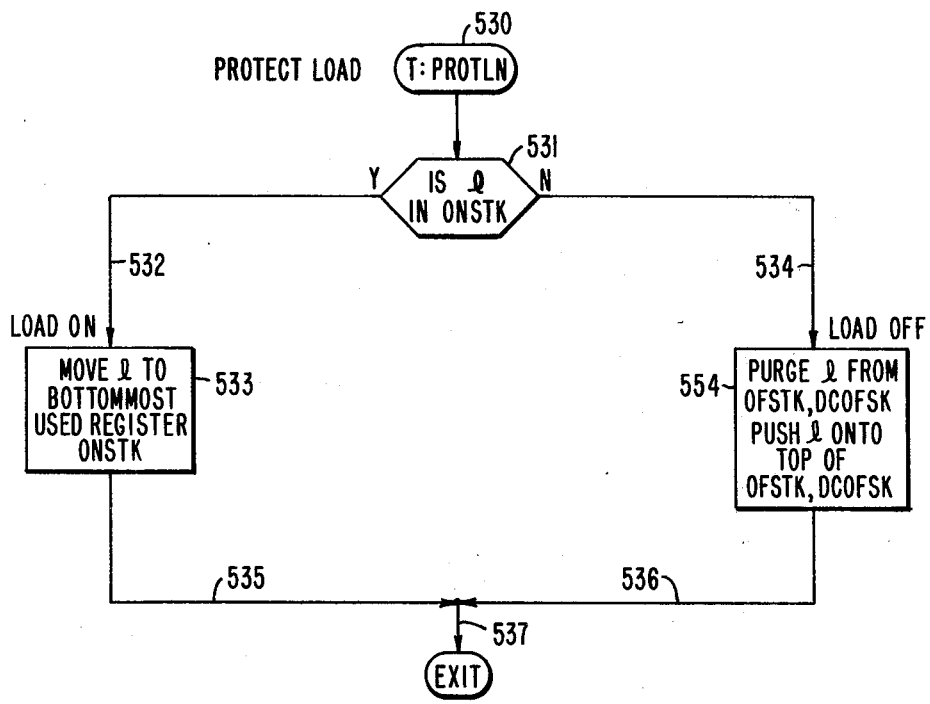

FIG. 11G describes the process for protecting a load. The subroutine at 530 is initiated by any protect load CCI or by a teletype command. At 531 the question is whether the particular load 1 is in ONSTK. If Yes, by 532, the load is ON and according to 533 the load is moved to the bottommost used (topmost unused register in ONSTK. Then by 535 and 537 the subroutine exits. If, however, the load is not already in memory ONSTK, then the load is OFF and according to step 534, the load is purged from OFSTK, and DCOFSK, and pushed onto the top of OFSTK (and DCOFSK, providing it was in DCOFSK). This is according to the preceding comments relative to FIG. 8 for the protected load.

Figure 11H:
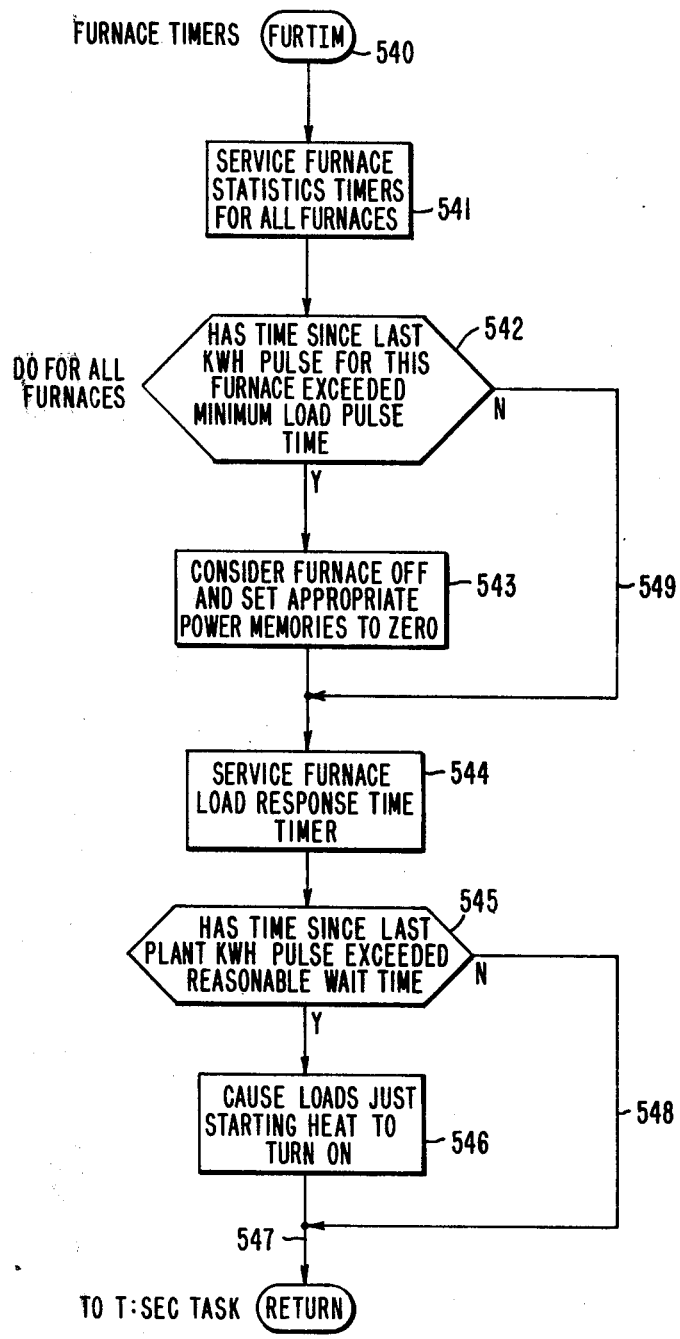

Considering FIG. 11H, a subroutine is shown which is periodically bid (usually once per second) in order to monitor the timers of the loads, or furnaces (FURTIM at 540).

At 541, the timers of the furnaces provide the time in heat, time between heats, time in heat with power OFF and time in heat and shed.

At 542 for all furnaces it is established whether the time lapsed since the last KWH pulse for a given furnace has exceeded the "minimum load" pulse time. If Yes, the furnace is considered as OFF and the appropriate power memories are set to zero, at 543. If the answer is No, by 549 step 543 is skipped and at 544 the timer providing the time of response of the furnace is serviced. Thereafter at 545 the test is made whether the time since the last plant KWH pulse has exceeded a reasonable wait time. If Yes, at 546 the loads just starting heat are caused to be turned ON. If NO, step 546 is skipped by 548 and the subroutine returns to its caller.

TABLE 1

TYPICAL SYSTEM TASK ASSIGNMENTS

| TN | TN | TN | LDN | PDN | TN |
|---|---|---|---|---|---|
| 0 T:DUMMY | 10 T:DPSH | 20 | T:SSIM | | 30 |
| 1 | 11 T:DLOG | 21 | | | 31 T:CISCAN |
| 2 | 12 T:FAIL | 22 | | | 32 |
| 3 T:30 | 13 | 23 | | | 33 |
| 4 | 14 T:DATA | 24 | | | 34 CCO |
| 5 | 15 T:TMDY | 25 | | | 35 CCI |
| 6 T:60 | 16 T:ECON | 26 | | | 36 |
| 7 | 17 T:STAT | 28 | 9 TTY R/P | | 37 |
| 8 T:ENDHT | 18 T:MPSH | 28 | 8 #1 TTY | 10 | 38 CONSOLE=DEBUG |
| 9 T:STRTHT | 19 T:ALG | 29 | | | 39 CONSOLE BID |
| A T:WARN | 1A | 2A | 6 PTR | | 3A |
| B | 1B | 2B | 5 CR | D | 3B CLOCK |
| C | 1C T:SEC | 2C | | | 3C |
| D T:MESS | 1D T:PWR | 2D | 3 #2 TTY | 20 | 3D MEMPAR PRINT |
| E T:PROTLN | 1E T:DEM | 2E | | | 3E HALT |
| F T:KYBD, CONS | 1F T:INKW | 2F | 1 | | 3F |

Table I lists the principal tasks associated with the operation of the system. The meaning of some of the mnemonics is as follows:

| Task # | Name | Meaning |
|---|---|---|
| 0 | T:DUMMY | Dummy Task |
| 3,6 | T:30,T:60 | Periodic Tasks for User |
| 8 | T:ENDHT | End Heat |
| 9 | T:STRTHT | Start Heat |
| A | T:WARN | Warning Message |
| D | T:MESS | Message (Log) Print |
| E | T:PROTLN | Protect Load Number |
| F | T:KYBD, CONS | Keyboard, Console |
| 10 | T:DPSH | Demand Pulse Special Task Hook |
| 11 | T:DLOG | Demand Log Print |
| 12 | T:FAIL | Power Fail |
| 13 | T:OSIM | On Line Simulation (Not Used) |
| 14 | T:DATA | Data Gathering for Logs |
| 15 | T:TMDY | Time of Day Scheduling |
| 16 | T:ECON | Energy Conservation |
| 17 | T:STAT | Status Printing |
| 18 | T:MPSH | Meter Pulse Special Task Hook |
| 19 | T:ALG | Control Algorithm |
| 1C | T:SEC | Periodic Task Every Second |
| 1D | T:PWR | Meter Energy/Power Calculations |
| 1E | T:DEM | Demand Pulse |
| 1F | T:INKW | Initial KWH Pulse |
| 20 | T:SSIM | Software Simulator |
| 28 | #1 TTY | Main Operator TTY Device |
| 2B | CR | Card Reader |
| 2D | #2 TTY | 2nd Display TTY Device |

-continued

| Task # | Name | Meaning |
| --- | --- | --- |
| 31 | T:CISCAN | CCI Scan (Bid 30-60 HZ) by Clock Task 3B) |
| 34 | CCO | RTX-6 CCO Task |
| 35 | CCI | RTX-6 CCI Task |
| 38 | CONSOLE=DEBUG | RTX-6 Debug Task |
| 39 | CONSOLE BID | RTX-6 Console Interrupt |
| 3B | CLOCK | RTX-6 225 Clock Task |
| 3D | MEMPAR PRINT | RTX-6 Memory Parity Error Printout |
| 3E | HALT | RTX-6 Halt Task |

Although the invention has been described in the specific context of the preferred embodiment, it is understood that variations are possible which are encompassed within the scope of the invention.

It is clear in the first place that the ON and OFF status of a load which for an arc furnace are given with priority for the production status may receive a different treatment between memories I, II and III for another kind of production unit. It is also true that not only two or three different memories can be used for a priority but for load selection. Status shifting between memories can be implemented more generally.

In the particular instance of an arc furnace, control signals may not necessarily relate to separate contact closures for "Start Heat" and "End Heat", since the same logic treatment would be possible with a single "In Heat" status contact closure.

Instead of metering the accumulated power consumed per load unit, the system could sense automatically the accumulated heat by reference to a power consumption pattern.

It has been shown that a certain priority may be given to a load which is "protected". Protection can be given to load on account of its progression following a pattern of power consumption, the time the load has been "In Heat", or other characteristic curve.

The control method according to the present invention is not limited to selection and control of units of production, such as arc furnaces. Other loads in the plant which are contributing to power consumption may also be controlled in the way shown by the prior art concurrently with the units of production. The priority means would then be expanded to include under another order of priority such other loads. In particular, the LOFO priority basis described in the context of the preferred embodiment would be used concurrently with a fixed priority mode of selection and control.

Other demand control schemes are possible, such as the floating window type in which there is no demand period pulse.

I claim:

1. A method of controlling the interruptible loads of a plant facility with a power demand controller assigning a demand limit to energy consumption, where said plant facility includes as said interruptible loads at least two load units of production having when operative a changing characteristic of power consumption from an individual starting time to an individual end time to provide respective production outputs; with said method comprising the steps of:
deriving a representation of the total amount of energy accumulated by said plant facility during a control period and of the current power drawn in said plant for predicting a demand at the end of said control period;
relating said predicted demand to said assigned demand limit for providing a demand error relative to said demand limit at the end of the control period;
selecting loads for switching into one of an ON and an OFF status according to a priority list based on one of the actual ON and OFF status of said loads and the individual power consumption thereof and according to said demand error to minimize the same;
switching a selected load and changing one of the actual ON and OFF status thereof in said priority list;
measuring the individual power consumption of each of said operative load units;
associating the measured individual power consumption with a corresponding operative load unit in said priority list; and
assigning a first priority in said priority list among said operative load units to the one having been switched the last in said load switching step, whereby in said load selecting step the first priority operative load unit is selected before another operative load unit.

2. The method of claim 1 with the last ON of said operative load units being first to be switched OFF.

3. The method of claim 1 with the last OFF of said operative load units being first to be switched ON.

4. The method of claim 1 with additional load units existing in said plant facility which are out of production, and each providing an availability signal when ready to enter production;
with any said additional load units having an availability signal being added to said priority list;
with said selecting step being inoperative on such listed additional load unit until all the operative load units are in the ON status.

5. The method of claim 4 with an operative load unit becoming an additional unit when its end time has been reached, a no selection signal being generated concurrently to prevent further selection by said selecting step; said no selection signal being overriden by an availability signal occurring when ready to enter production.

6. The method of claim 1 with a protective status being assigned to an operative load in the OFF status by giving it a priority position in said priority list that precedes an operative load which has been last to be switched OFF.

7. The method of claim 1 with a protective status being assigned to an operative load in the ON status by giving it a position in said priority list that follows an operative load which has been the first to be switched ON.

* * * * *